United States Patent
Futami et al.

(10) Patent No.: US 8,428,470 B2
(45) Date of Patent: Apr. 23, 2013

(54) WAVEFORM SHAPING APPARATUS, OPTICAL TRANSMISSION SYSTEM, AND WAVEFORM SHAPING METHOD

(75) Inventors: Fumio Futami, Kawasaki (JP); Shigeki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 881 days.

(21) Appl. No.: 12/073,035

(22) Filed: Feb. 28, 2008

(65) Prior Publication Data
US 2008/0232817 A1   Sep. 25, 2008

(30) Foreign Application Priority Data
Mar. 19, 2007   (JP) ................................. 2007-071675

(51) Int. Cl.
*H04B 10/00* (2006.01)

(52) U.S. Cl.
USPC ........... 398/175; 398/173; 398/180; 398/158; 398/159; 398/160; 359/342

(58) Field of Classification Search .......... 398/158–160, 398/173, 175, 180; 359/334–344
See application file for complete search history.

(56) References Cited

U.S. PATENT DOCUMENTS

| | | | |
|---|---|---|---|
| 6,885,499 B1 * | 4/2005 | Hoshida et al. ................ 359/337 |
| 7,394,841 B1 * | 7/2008 | Konttinen et al. ....... 372/45.013 |
| 2001/0028755 A1 * | 10/2001 | Akiyama ........................ 385/14 |
| 2002/0015553 A1 * | 2/2002 | Claringburn et al. ........... 385/24 |
| 2002/0041415 A1 * | 4/2002 | Tanaka et al. ................ 359/179 |
| 2002/0105743 A1 | 8/2002 | Shen |
| 2002/0171920 A1 * | 11/2002 | Sugawara ..................... 359/344 |
| 2003/0002135 A1 | 1/2003 | Futami et al. |
| 2003/0090779 A1 * | 5/2003 | Lee ................................ 359/334 |
| 2003/0185564 A1 * | 10/2003 | Hayashi et al. ................. 398/33 |
| 2005/0019037 A1 * | 1/2005 | Luo et al. ...................... 398/164 |
| 2005/0058416 A1 * | 3/2005 | Hoon Lee et al. ............ 385/122 |
| 2006/0204170 A1 * | 9/2006 | Igarashi et al. ................. 385/24 |
| 2006/0245456 A1 * | 11/2006 | Lasri et al. ..................... 372/18 |

FOREIGN PATENT DOCUMENTS

| | | |
|---|---|---|
| EP | 1 298 827 | 4/2003 |
| JP | 2003-15097 | 1/2003 |

OTHER PUBLICATIONS

Akiyama: "Recent Progress in Quantum-Dot Semiconductor Optical Amplifiers for Optical Signal Processing", Optical Amplifier and Their Applications, Aug. 7, 2005, paper MB1, pp. 1-3.*

M. Sugawara et al., "Quantum-dot semiconductor optical amplifiers for high-bit-rate signal processing up to 160 Gb s$^{-1}$ and new scheme of 3R regenerators", Measurement Science and Technology, vol. 13, No. 11; Nov. 1, 2002; pp. 1683-1691.

(Continued)

*Primary Examiner* — Li Liu
(74) *Attorney, Agent, or Firm* — Staas & Halsey LLP

(57) ABSTRACT

A waveform shaping apparatus includes a quantum dot optical amplifier in which an amplification factor of input signal beams saturates if the optical power of the signal beams is equal to or greater than a predetermined value; and a quantum dot saturable absorber in which an absorption factor of the input signal beams saturates if the optical power of the signal beams is under a predetermined value. The quantum dot optical amplifier and the quantum dot saturable absorber are connected in series with a transmission path of the signal beams, and shape the waveform of the signal beams. Voltages applied to the quantum dot optical amplifier and the quantum dot saturable absorber, respectively, are adjusted based on the optical power of the signal beams.

18 Claims, 22 Drawing Sheets

OTHER PUBLICATIONS

M. Sugawara et al., "Recent progress in self-assembled quantum-dot optical devices for optical telecommunication: temperature-insensitive 10 Gb s$^{-1}$ directly modulated lasers and 40 Gb s$^{-1}$ signal-regenerative amplifiers", Journal of Physics D: Applied Physics, vol. 38, No. 13, Jul. 7, 2005; pp. 2126-2134.

M.G. Thompson et al., "Properties of InGaAs quantum dot saturable absorbers in monolithic mode-locked lasers", Semiconductor Laser Conference, IEEE Sep. 21, 2004; pp. 53-54.

Extended European Search Report issued Jun. 12, 2008 in corresponding European Patent Application No. 08003553.8.

M. Gendry, et al., "Experimental evidence for critical 2D nuclei in the 2D/3D growth mode transition of a compressive and tensile strained InGaAs on InP (001)", *Journal of Crystal Growth 257* (2003), pp. 51-59.

H. R. Gutierrez, et al., "Role of group V exchange on the shape and size of InAs/InP self-assembled nanostructures", *Journal of Applied Physics*, vol. 92, No. 12, Dec. 15, 2002, pp. 7523-7526.

S. Frechengues, et al., "Wavelength tuning of InAs quantum dots grown on (311)B InP", *Applied Physics Letters*, vol. 74, No. 22, May 31, 1999, pp. 3356-3358.

\* cited by examiner

OPTICAL AMPLIFIER
(TOP VIEW)

WAVEFORM SHAPING APPARATUS, OPTICAL TRANSMISSION SYSTEM, AND WAVEFORM SHAPING METHOD

BACKGROUND OF THE INVENTION

1. Field of the Invention

The present invention relates to a waveform shaping apparatus that shapes a waveform of a signal beam, and more specifically, to a waveform shaping apparatus, an optical transmission system, and a waveform shaping method that can simultaneously shape waveforms of a plurality of signal beams each having a wavelength assigned to a channel.

2. Description of the Related Art

To prevent waveform degradation of a signal beam transmitted over an optical fiber, various waveform shaping technologies have been thought out and commercialized.

One example of the waveform shaping technologies is disclosed in Japanese Patent Application Laid-open No. 2003-15097. FIG. 24 is a schematic for explaining a waveform shaping technology according to this disclosure. This document discloses a waveform shaping technology that shapes a waveform of a signal beam using two optical gates (OGs) (a first OG and a second OG).

As shown in FIG. 24, a signal beam is input to the first OG together with a probe beam emitted from a laser diode (LD). By driving a bulk electroabsorption modulator by a reverse bias as the first OG, data in the signal beam is transferred to the probe by cross-absorption modulation (XAM) effect.

Due to screening or band-filling effects of a photoexcited carrier, saturation occurs in absorption, and the data in the signal beam is transferred to the probe non-linearly with respect to the power of the signal beam, thus suppressing a space level noise resulted from wavelength dispersion. Because the beam transferred with the data has a different wavelength from that of the original signal beam, the former can be separated from the latter at an optical bandpass filter (BPF). By sending the signal beam separated at the BPF to the second OG (a gain clamp amplifier such as a distributed feedback (DFB) laser), a mark level noise resulted from dispersion can be suppressed (waveform shaping can be provided).

However, due to the underlining principle, the above-described waveform shaping technology cannot provide simultaneous waveform shaping for WDM signal beams.

In other words, it has become important to achieve a waveform shaping technology that can shape waveforms of a plurality of signal beams each having a wavelength assigned to a channel.

SUMMARY OF THE INVENTION

It is an object of the present invention to at least partially solve the problems in the conventional technology.

According to an aspect of the present invention, a waveform shaping apparatus includes an optical amplifier that is provided with a substrate having layers of quantum dots and that amplifies a signal beam having a wavelength corresponding to a size of the quantum dots; an amplification saturating unit that saturates an amplification factor for the signal beam going through the optical amplifier if power of the signal beam is equal to or greater than a predetermined value, by applying a positive voltage to the optical amplifier; and an absorption saturating unit that saturates an absorption factor for the signal beam going through the optical amplifier if power of the signal beam is under a predetermined value, by applying a negative voltage to the optical amplifier.

According to another aspect of the present invention, a waveform shaping apparatus includes an optical amplifier that is provided with a substrate having layers of quantum dots and that amplifies a signal beam having a wavelength corresponding to a size of the quantum dots; and an amplification saturating unit that saturates an amplification factor for the signal beam going through the optical amplifier if power of the signal beam is equal to or greater than a predetermined value, by applying a positive voltage to the optical amplifier.

According to still another aspect of the present invention, an optical transmission system includes a mesh-topology network having transmission paths for signal beams and optical nodes, and over which terminals exchange data. The optical nodes has a function to switch the transmission paths for the signal beams and separate each of the signal beams into beams at each wavelength; and the waveform shaping apparatus according to the present invention is provided to at least one of an input terminal of each of the optical nodes that the signal beam is input to and an output terminal thereof that the signal beam is output from.

According to still another aspect of the present invention, an optical transmission system includes a network having transmission paths of an optical fiber, the network being used by terminals to exchange data, wherein a waveform shaping apparatus according to the present invention is provided between the transmission paths.

According to still another aspect of the present invention, a waveform shaping method is for a waveform shaping apparatus that includes an optical amplifier that is provided with a substrate having layers of quantum dots and that amplifies a signal beam having a wavelength corresponding to a size of the quantum dots. The waveform shaping method includes saturating an amplification factor for the signal beam going through the optical amplifier if power of the signal beam is equal to or greater than a predetermined value, by applying a positive voltage to the optical amplifier; and saturating an absorption factor for the signal beam going through the optical amplifier if power of the signal beam is under a predetermined value, by applying a negative voltage to the optical amplifier.

According to still another aspect of the present invention, a waveform shaping method is for a waveform shaping apparatus that includes an optical amplifier that is provided with a substrate having layers of quantum dots and that amplifies a signal beam having a wavelength corresponding to a size of the quantum dots. The waveform shaping method includes saturating an absorption factor of a signal beam going through the optical amplifier if power of the signal beams is under a predetermined value by applying a negative voltage to the optical amplifier; and saturating an amplification factor of a signal beam going through the optical amplifier if power of the signal beam is equal to or greater than a predetermined value by applying a positive voltage to the optical amplifier.

The above and other objects, features, advantages and technical and industrial significance of this invention will be better understood by reading the following detailed description of presently preferred embodiments of the invention, when considered in connection with the accompanying drawings

DETAILED DESCRIPTION OF THE PREFERRED EMBODIMENTS

Exemplary embodiments of the waveform shaping apparatus, the optical transmission system, and the waveform shaping method according to the present invention will be now explained in detail with reference to the attached drawings.

To begin with, a general outline and characteristics of a waveform shaping apparatus according to a first embodiment of the present invention will be now explained. The waveform shaping apparatus according to the first embodiment includes a plurality of optical amplifiers, each having a substrate with quantum dots layered thereon (such as an InP or a GaAs substrate), that amplify a signal beam having an optical wavelength corresponding to the size of the quantum dot. A positive voltage (forward bias) is applied to one of the optical amplifiers. Therefore, if the power of the signal beams passing through the optical amplifier is equal to or greater than a predetermined value, an amplification factor of the signal beams saturates. Moreover, a negative voltage (reverse bias) is applied to the other optical amplifier (a different amplifier from that applied with the forward bias). Therefore, if the power of the signal beams passing through the optical amplifier drops below a predetermined value, an absorption factor of the signal beams saturates.

The optical amplifier applied with the forward bias is hereinafter, referred to as a "quantum dot optical amplifier", and the optical amplifier applied with the reverse bias is hereinafter, referred to as a "quantum dot saturable absorber".

The waveform shaping apparatus according to the first embodiment can provide a simultaneous waveform shaping to the waveforms of the signal beams, each having a wavelength assigned to a channel, by allowing the signal beams to pass through the quantum dot optical amplifier and the quantum dot saturable absorber having quantum dots adjusted in size. In this manner, the entire system can be simplified.

The optical amplifier that has the substrate with quantum dots layered thereon and amplifies a signal beam at an optical wavelength corresponding to the size of the quantum dots (hereinafter, referred simply to as "optical amplifier") will be now explained. Instead of a generally available quantum well (QW) structure, the optical amplifier according to the first embodiment uses a structure of quantum dots of sizes between several nanometers to several tens of nanometers.

Figure 1:
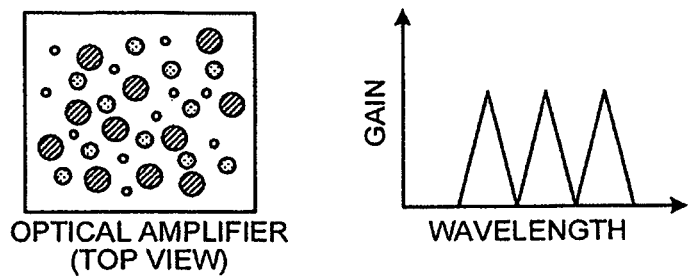
FIG. 1 is a schematic for explaining an optical amplifier according to a first embodiment of the present invention.

FIG. 1 is a schematic for explaining the optical amplifier according to the first embodiment. The schematic at the left in FIG. 1 is a top view of the optical amplifier. This optical amplifier includes spherical quantum dots layered on an InP or a GaAs substrate. Therefore, the optical amplifier does not have to rely on wave polarization of the signal beam (therefore, the optical amplifier independent from wave polarization can be realized.)

The size of the quantum dots determines a gain characteristic for a signal beam having a wavelength. Therefore, if the quantum dots of three different sizes are mixed in the optical amplifier, as shown at the left in FIG. 1, three different peak gain characteristics can be obtained as shown at the right in FIG. 1. For example, the quantum dots of the smallest size amplify the signal beam at the lowest optical wavelength bandwidth as shown in the diagram at the right in FIG. 1. The quantum dots with the second smallest size amplify the signal beam at the second lowest optical wavelength bandwidth, and the quantum dots with the largest size amplify the signal beam at the highest optical wavelength bandwidth.

Due to quantum dots size effect, the quantum dots of different sizes display uneven gain characteristics (only the signal beam having the optical wavelength corresponding to the size of quantum dots can receive the gain, and other signal beams cannot receive a gain). Therefore, it is possible to amplify only the signal beam having a wavelength corresponding to the quantum dots size. The optical amplifier including the quantum dots can be operated by applying a direct current bias. The waveform shaping of this optical amplifier does not have any relationship with a bit rate of the signal beam.

The layers of the quantum dots of different sizes can be formed on an InP or a GaAs substrate using any methods. Examples of the applicable methods are disclosed in known documents, such as M. Gendy and G Hollinger, Journal of Crystal Growth 257 (2003) 51-59, H. R. Gutierrenz, et al., Journal of Applied Physics 12 (2002) 7523-7526, and S. Frechengues, et al., Applied Physics Letters 22 (1999) 3356-3358.

The optical amplifier with the quantum dots can be self-formed in Stranski-Krastanov (S-K) mode. In this manufacturing method, a thin, two-dimensional layer (a layer called "wetting layer") is formed on a substrate having a different crystalline lattice constant, and subsequently, island-like, three-dimensional structures emerge (these island-like structures form the quantum dots). Quantum dots of different sizes can be self-formed by changing the thickness, the distortion, or the distribution of the thin two-dimensional layer during this crystal growth by self-formation.

After conducting a lab experiment, for example, to determine the wavelength that receives a gain from the quantum dots of a particular size, the optical amplifier is manufactured by adjusting the sizes of quantum dots so that the signal beams at desired wavelengths are amplified.

Figure 2:
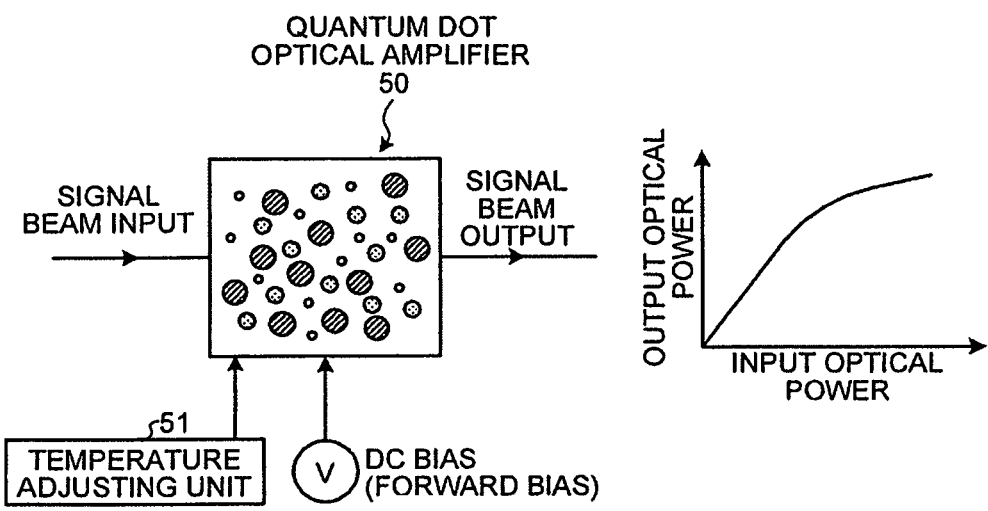
FIG. 2 is a schematic for explaining a quantum dot optical amplifier according to the first embodiment.

A quantum dot optical amplifier according to the first embodiment will be now explained. FIG. 2 is a schematic for explaining the quantum dot optical amplifier according to the first embodiment. When the signal beams are input to a quantum dot optical amplifier 50 that is driven by a forward bias, the power of the signal beams (optical power thereof) is amplified, and the signal beams are output from the quantum dot optical amplifier 50. As shown at the right in FIG. 2, if the signal beams input to the quantum dot optical amplifier 50 have an optical power equal to or greater than a predetermined value, the gain received therefrom saturates (the amplification factor saturates). Therefore, the optical power of the signal beams output from the quantum dot optical amplifier 50 also saturates. Because of these characteristics, even if the waveforms of the signal beams are degraded due to wavelength dispersion, the mark level waveform of the signal beams (a portion of the waveform of the signal beams with the optical power equal to or greater than the predetermined value) can be compensated. The quantum dot optical amplifier 50 is also connected to a temperature adjusting unit 51.

The temperature adjusting unit 51 maintains the temperature of the quantum dot optical amplifier 50 at a temperature predefined by an administrator or the like. By keeping the temperature of the quantum dot optical amplifier 50 constant, the wavelength-dependency of the quantum dot optical amplifier 50 can be also kept constant.

Figure 3:
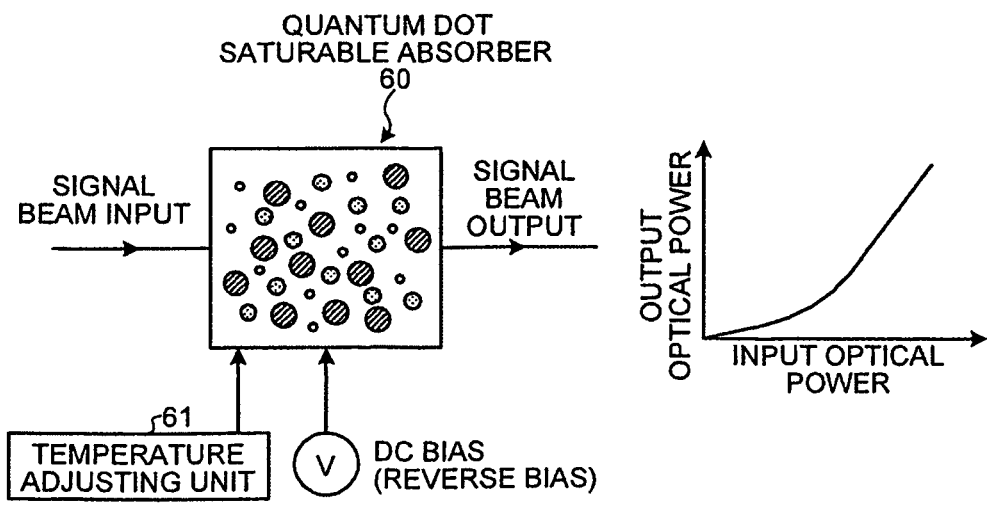
FIG. 3 is a schematic for explaining a quantum dot saturable absorber according to the first embodiment.

A quantum dot saturable absorber according to the first embodiment will be now explained. FIG. 3 is a schematic diagram for explaining the quantum dot saturable absorber according to the first embodiment. The quantum dot saturable absorber 60 driven by a reverse bias has an optical input-output characteristic as shown at the right in FIG. 3. As shown in FIG. 3, the absorption factor saturates when the optical power of the signal beam input to the quantum dot saturable absorber 60 is under a predetermined value. Because of this characteristic, even if the waveforms of the signal beams are degraded due to wavelength dispersion, the space level waveform of that signal beam (a portion of the waveform of the signal beam with the optical power under the predetermined value) can be compensated. The quantum dot saturable absorber 60 is also connected to a temperature adjusting unit 61.

The temperature adjusting unit 61 maintains the temperature of the quantum dot saturable absorber 60 at a temperature predefined by an administrator or the like. By keeping the temperature of the quantum dot saturable absorber 60 constant, the wavelength dependency of the quantum dot saturable absorber 60 is also kept constant.

Figure 4:
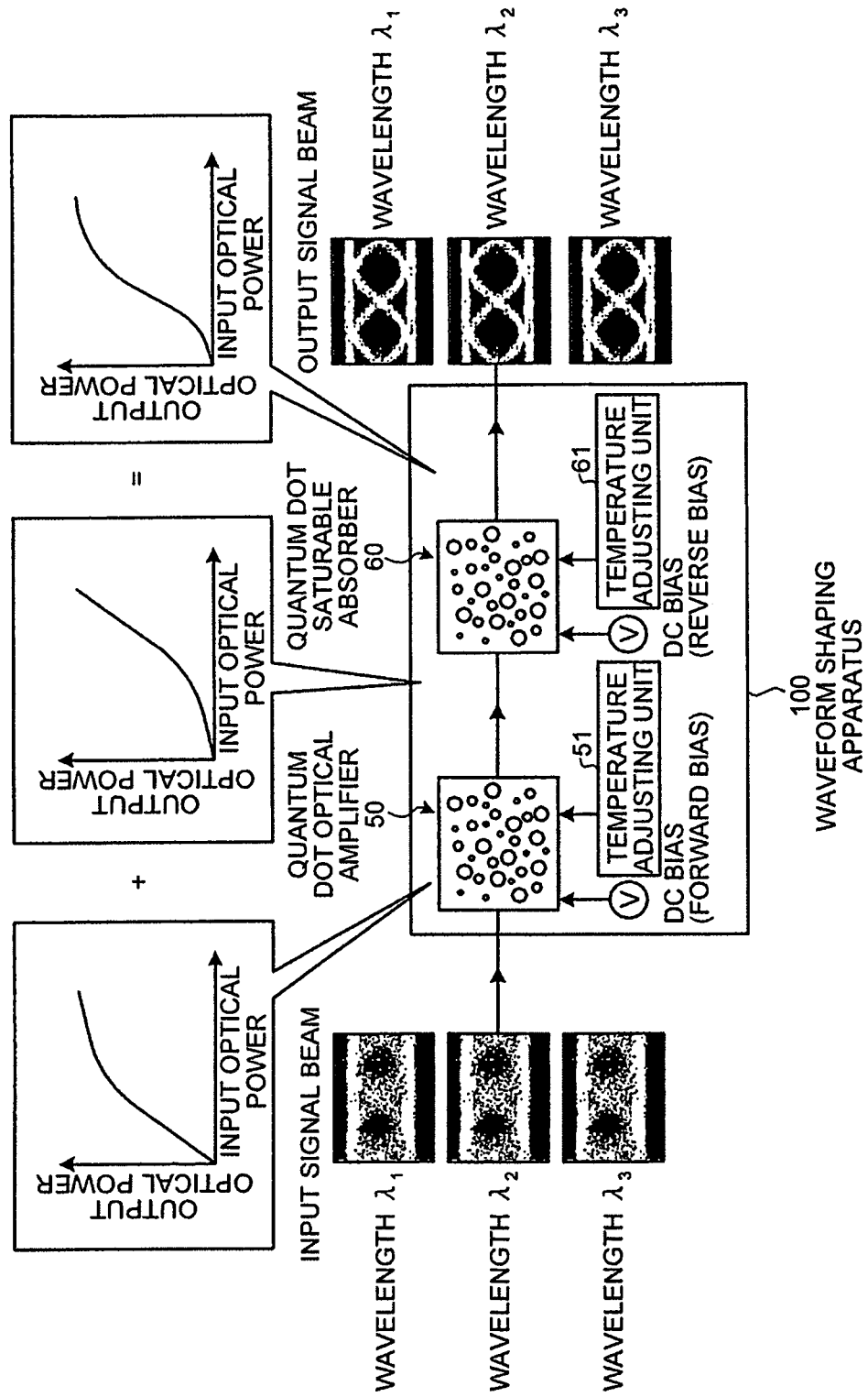
FIG. 4 is a schematic of a waveform shaping apparatus according to the first embodiment.

A waveform shaping apparatus according to the first embodiment will be now explained. FIG. 4 is a schematic of a waveform shaping apparatus 100 according to the first embodiment. As shown in FIG. 1, the waveform shaping apparatus 100 includes the quantum dot optical amplifier 50 and the quantum dot saturable absorber 60. The forward bias is applied to the quantum dot optical amplifier 50, and the reverse bias is applied to the quantum dot saturable absorber 60. The temperature of the quantum dot optical amplifier 50 is kept constant by the temperature adjusting unit 51, and the temperature of the quantum dot saturable absorber 60 is kept constant by the temperature adjusting unit 61.

When signal beams (each at an optical wavelength corresponding to a size of the quantum dots, and shown to have optical wavelengths $\lambda_1$, $\lambda_2$, and $\lambda_3$ in the example shown in FIG. 4) are input to the waveform shaping apparatus 100, the mark level noise components thereof are compressed at the quantum dot optical amplifier 50. Subsequently, the space level noise components thereof are compressed at the quantum dot saturable absorber 60. In other words, by the signal beam going thorough the waveform shaping apparatus 100, the mark level and space level waveforms can be shaped.

In the waveform shaping apparatus 100 shown in FIG. 4, the signal beams are input to the quantum dot optical amplifier 50, and subsequently to the quantum dot saturable absorber 60. However, the present invention is not limited in such an arrangement, and the waveform shaping apparatus 100 may also be arranged so that the signal beam is input to the quantum dot saturable absorber 60, and subsequently to the quantum dot optical amplifier 50. In other words, the quantum dot optical amplifier 50 and the quantum dot saturable absorber 60 connected in series can be combined in any way.

The waveform shaping apparatus 100 includes an output power adjusting circuit (not shown). The output power adjusting circuit adjusts a voltage of the forward bias applied to the quantum dot optical amplifier 50 so that characteristics (e.g., optical power of the signal beam) of the signal beam output from the quantum dot optical amplifier 50 is adjusted to a predetermined value.

The output power adjusting circuit also adjusts a voltage of the reverse bias applied to the quantum dot saturable absorber 60 so that characteristics (e.g., optical power of the signal beam) of the signal beam output from the quantum dot saturable absorber 60 is adjusted to a predetermined value.

Figure 5:
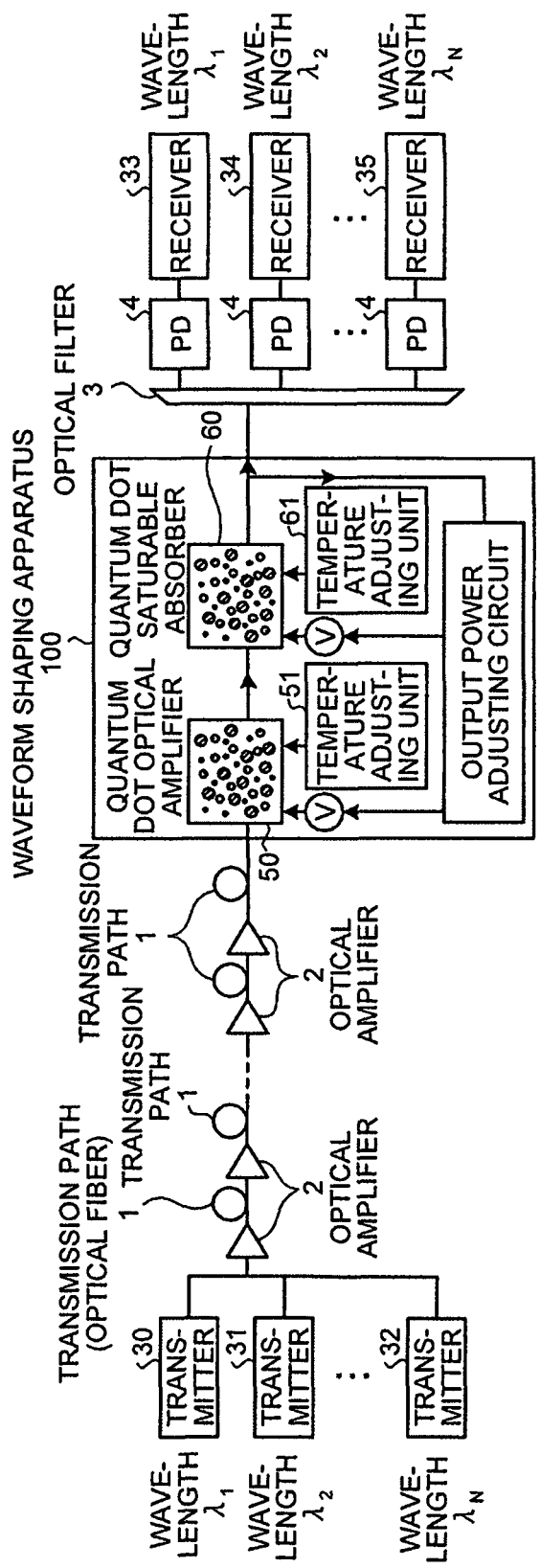
FIG. 5 is a schematic of a system configuration of an optical transmission system with application of the waveform shaping apparatus shown in FIG. 4.
Figure 6:
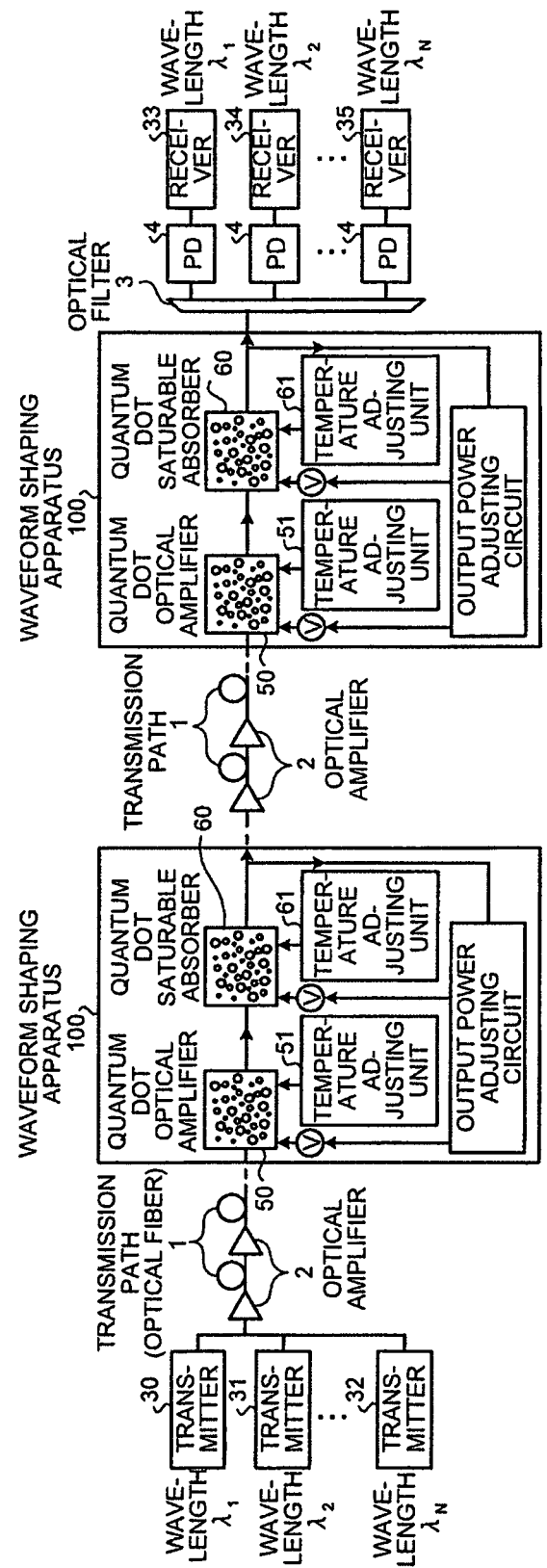
FIG. 6 is a schematic of another system configuration of the optical transmission system with application of the waveform shaping apparatus shown in FIG. 4.

Application of the waveform shaping apparatus 100 according to the first embodiment to an optical transmission system will be now explained. FIGS. 5 and 6 are schematics of system configurations where the waveform shaping apparatus according to the first embodiment is applied to an optical transmission system.

The optical transmission system shown in FIG. 5 includes transmission paths 1, optical amplifiers 2, an optical filter 3, photo diodes (PDs) 4, transmitters 30 to 32, receivers 33 to 35, and the waveform shaping apparatus 100. The optical amplifiers 2 may be of any type.

The optical filter 3 demultiplexes wavelength-division multiplexed (WDM) signal beams to a plurality of signal beams at a corresponding wavelength. The PD 4 is an apparatus that converts a signal beam into an electrical signal.

The signal beams output from the transmitters 30 to 32 are multiplexed at a wavelength division multiplexer (WDM) (not shown), and transmitted over the transmission paths 1 having the optical amplifiers 2, and reach the receivers 33 to 35 via the waveform shaping apparatus 100, the optical filter 3, and the PDs 4.

The waveform shaping apparatus 100 can compensate the waveforms of the signal beams degraded over the transmission paths all at once, passing therethrough in a bulk, regardless of the modulation method or the modulation speed of the signal beams, while maintaining the wavelengths thereof.

The optical transmission system shown in FIG. 6 performs a waveform shaping to wavelength-division-multiplexed (WDM) signal beams in the same manner as the optical transmission system shown in FIG. 5. However, the former includes another waveform shaping apparatus 100 in the transmission paths, in addition to the waveform shaping apparatus 100 provided at the receiving end (in front of the optical filter 3). In the optical transmission system shown in FIG. 6, because the waveform shaping apparatus (please make the same correction hereinafter) 100 are provided in the transmission paths, a Q-factor of the signal beam can be improved, allowing extension of transmission distance.

Figure 7:
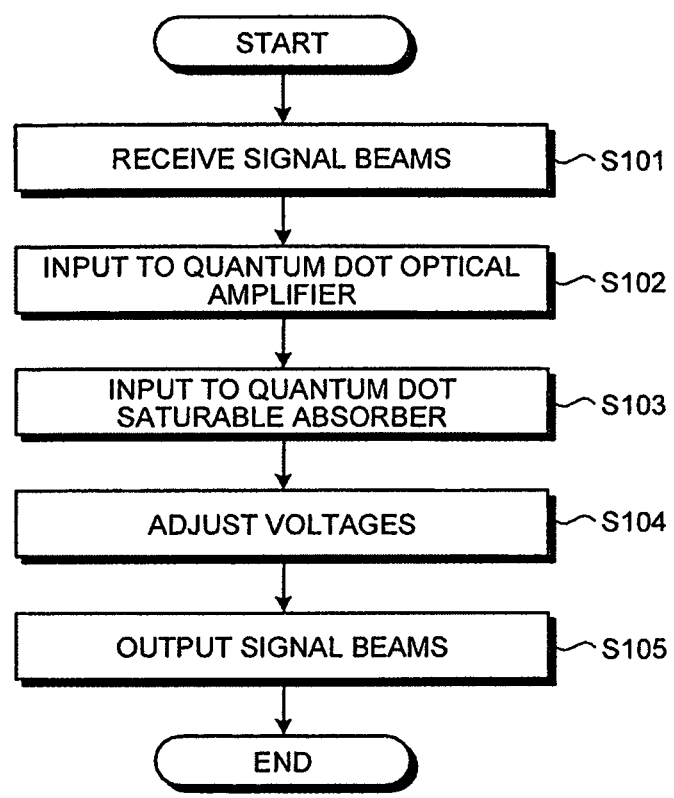
FIG. 7 is a flowchart of process performed by the waveform shaping apparatus shown in FIG. 4.

A process performed by the waveform shaping apparatus 100 according to the first embodiment will be now explained. FIG. 7 is a flowchart of the process performed by the waveform shaping apparatus 100 according to the first embodiment. As shown in FIG. 7, the waveform shaping apparatus 100 receives signal beams (step S101), and input the received signal beams to the quantum dot optical amplifier 50 to compress the mark level noise therein (step S102).

The waveform shaping apparatus 100 inputs the signal beams output from the quantum dot optical amplifier 50 to the quantum dot saturable absorber 60 to compress the space level nose therein (step S103). The output power adjusting circuit adjusts the forward bias applied to the quantum dot optical amplifier 50 and the reverse bias applied to the quantum dot saturable absorber 60, respectively, so to bring the optical power of the signal beams, output from the quantum dot optical amplifier 50 and quantum dot saturable absorber 60, respectively, to given values (step S104). The waveform shaping apparatus 100 then outputs the signal beams after the waveform shaping (step S105).

As described above, by inputting the signal beams to the quantum dot optical amplifier 50 and the quantum dot saturable absorber 60, the signal beams, each having a wavelength assigned to a channel, can be compensated all at once. Moreover, the step S102 and the step S103 may be performed in a reverse order. That is, the signal beam can be input to the quantum dot optical amplifier 50 after being input to the quantum dot saturable absorber 60.

As described above, the waveform shaping apparatus 100 according to the first embodiment includes the quantum dot optical amplifier 50 with the amplification factor of the signal beam that saturates in a portion where the optical power of the input signal beams is equal to or greater than a predetermined value, and the quantum dot saturable absorber 60 with the absorption factor of the signal beam that saturates in a portion where the optical power of the input signal beams is under a predetermined value. The quantum dot optical amplifier 50 and the quantum dot saturable absorber 60 are connected in series with the transmission path of the signal beams, and shape the waveform of these signal beams. Therefore, the waveform shaping can be provided to signal beams, each at a wavelength, without relying on the wave polarization, the modulation speed, or the modulation format while maintaining the wavelengths thereof.

Because the waveform shaping apparatus 100 according to the first embodiment performs the waveform shaping with the optical amplifiers with layers of quantum dots, the waveform shaping apparatus 100 can be also reduced in size.

The waveform shaping apparatus 100 according to the first embodiment performs the waveform shaping with the combination of the quantum dot optical amplifier 50 and the quantum dot saturable absorber 60. However, it is also possible to provide the waveform shaping apparatus 100 with a timing recovery function. By adding the timing recovery function (the function to compensate a time lag of the pulse and to recover to the predetermined time), 3Rs (Re-generation, Re-shaping, and Re-timing) of the signal beam can be recovered.

A general structure and characteristics of a waveform shaping apparatus according to a second embodiment of the present invention will be now explained. The waveform shaping apparatus according to the second embodiment includes a filter (an equalizer) that adjusts the power of each of the wavelength of the signal beams, and the signal beams are input thereto. The signal beams, with wavelengths whose powers are adjusted and output from the filter, is input to the optical amplifier and the quantum dot saturable absorber, and the waveforms of the signal beams are shaped therein.

The waveform shaping apparatus according to the second embodiment can adjust the power of each of the wavelengths of the signal beams by using the filter. Therefore, each of the wavelengths can be adjusted to the power most suitable for a quantum dot optical amplifier 210 and a quantum dot saturable absorber 220 that perform the waveform shaping of the signal beams.

Figure 8:
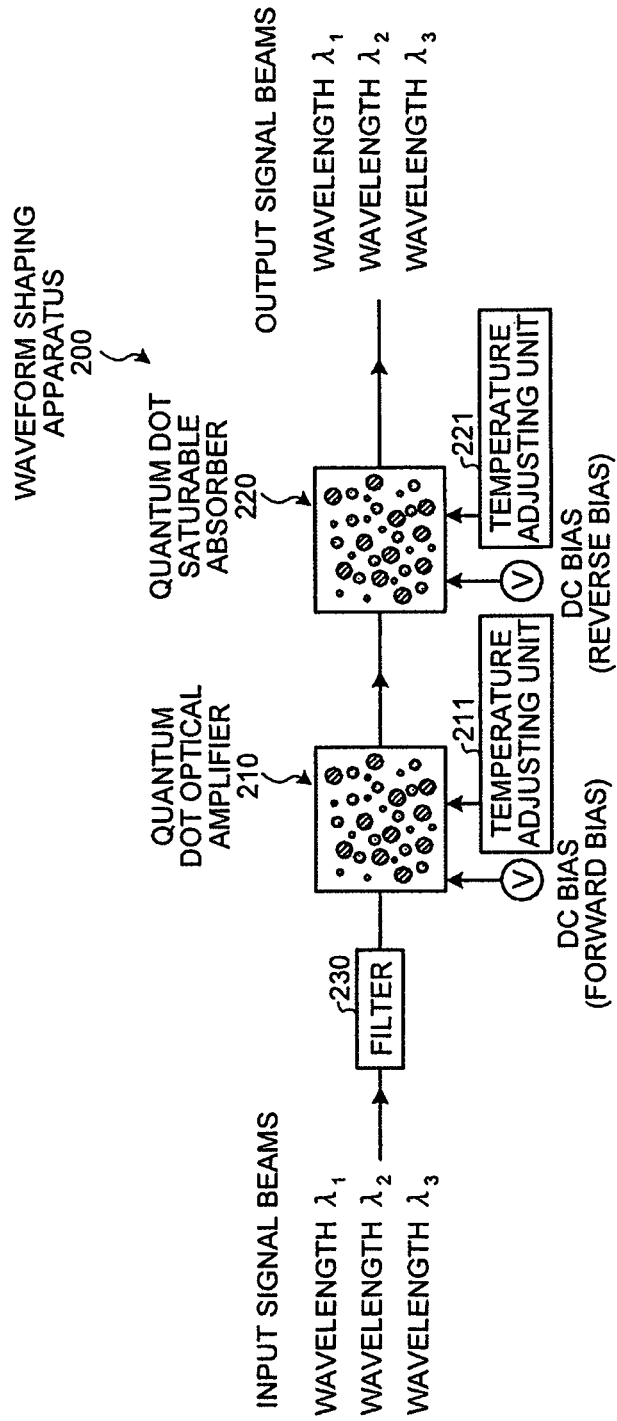
FIG. 8 is a schematic of a waveform shaping apparatus according to a second embodiment of the present invention.

A structure of the waveform shaping apparatus according to the second embodiment will be now explained. FIG. 8 is a schematic of a waveform shaping apparatus 200 according to the second embodiment. As shown in FIG. 8, the waveform shaping apparatus 200 includes the quantum dot optical amplifier 210, the quantum dot saturable absorber 220, and an equalizing filter 230.

The quantum dot optical amplifier 210 corresponds to the quantum dot optical amplifier 50 explained in FIG. 2, and the forward bias is applied to the quantum dot optical amplifier 210. The quantum dot optical amplifier 210 is maintained at a predetermined temperature set by a temperature adjusting unit 211.

The quantum dot saturable absorber 220 corresponds to the quantum dot saturable absorber 60 explained in FIG. 3, and the reverse bias is applied to the quantum dot saturable absorber 220. The quantum dot saturable absorber 220 is maintained at a predetermined temperature set by a temperature adjusting unit 221.

Figure 9:
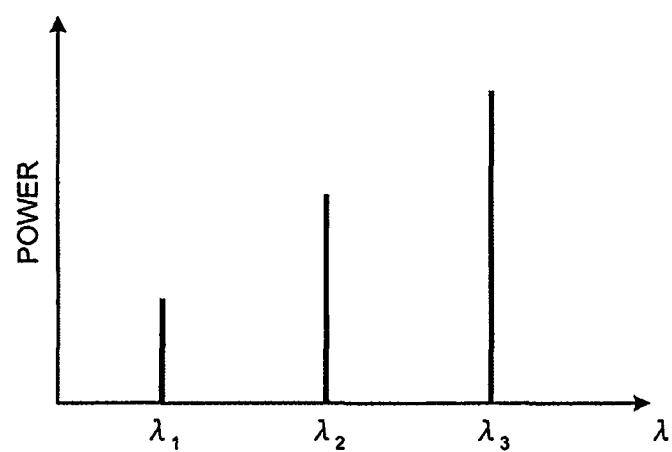
FIG. 9 is a schematic for explaining an example of power adjustment performed by an equalizing filter.

The equalizing filter 230 is a filter (an equalizer) that adjusts the power of the wavelengths of the signal beams to predetermined powers. FIG. 9 is a schematic for explaining an example of power adjustment performed by the equalizing filter 230. As shown in FIG. 9, the equalizing filter 230 increases the power of the wavelengths $\lambda_1$, $\lambda_2$, and $\lambda_3$ (where, $\lambda_1 < \lambda_2 < \lambda_3$), respectively, to be input to the quantum dot optical amplifier 210 and the quantum dot saturable absorber 220, so that the powers thereof become greater in the order of $\lambda_1$, $\lambda_2$, and $\lambda_3$.

A degree by which the equalizing filter 230 should increase the power of each of the wavelengths depends on the characteristics of the waveform shaping performed by the quantum dot optical amplifier 210 and the quantum dot saturable absorber 220. Therefore, the administrator should find out the power most suitable for the waveform shaping performed by the quantum dot optical amplifier 210 and the quantum dot saturable absorber 220 for each of the wavelengths in advance, and adjust the equalizing filter 230 so that each of the wavelengths is adjusted the most suitable power.

When signal beams are input to the waveform shaping apparatus 200, the equalizing filter 230 adjusts the power of each of the wavelengths of the signal beams. Then the quantum dot optical amplifier 210 compresses the mark level noise included in the signal beams in which the power of each of the wavelengths thereof is adjusted, and the quantum dot saturable absorber 220 compress the space level noise, respectively. In other words, by the signal beams going through the waveform shaping apparatus 200, the mark level noise and the space level noise are compressed therein.

As described above, the waveform shaping apparatus 200 according to the second embodiment includes the equalizing filter 230 that adjusts the power of each of the wavelengths of the signal beams. After the signal beams are input to the equalizing filter 230 and the power of each of the wavelengths of the signal beams is adjusted, the signal beams are input to the quantum dot optical amplifier 210 and the quantum dot saturable absorber 220 to be provided with the waveform shaping thereby. Because the power of each of the wavelengths of the signal beams is adjusted to the level most suitable for the quantum dot optical amplifier 210 and the quantum dot saturable absorber 220, therefore, more precise waveform shaping can be provided to the signal beams.

In the waveform shaping apparatus 200 according to the second embodiment, the positions of the quantum dot optical amplifier 210 and the quantum dot saturable absorber 220 shown in FIG. 8 may be switched.

A general structure and characteristics of a waveform shaping apparatus according to a third embodiment of the present invention will be now explained. The waveform shaping apparatus according to the third embodiment adjusts the power of each of the wavelengths of the signal beams using the filter, and performs the waveform shaping to the signal beams, output from the filter and having the adjusted wavelengths, using the quantum dot optical amplifier and the quantum dot saturable absorber, in the same manner as described above. Furthermore, the waveform shaping apparatus according to the third embodiment also monitors the signal beam output from the quantum dot saturable absorber (or from the quantum dot optical amplifier) so as to adjust the forward bias and the reverse bias applied to the quantum dot optical amplifier and the quantum dot saturable absorber, respectively.

As described above, the waveform shaping apparatus according to the third embodiment monitors the signal beams output from the quantum dot optical amplifier and the quantum dot saturable absorber, and adjusts the forward bias and the reverse bias applied to the quantum dot optical amplifier and the quantum dot saturable absorber, respectively. Therefore, more precise waveform shaping can be provided to the signal beams.

Figure 10:
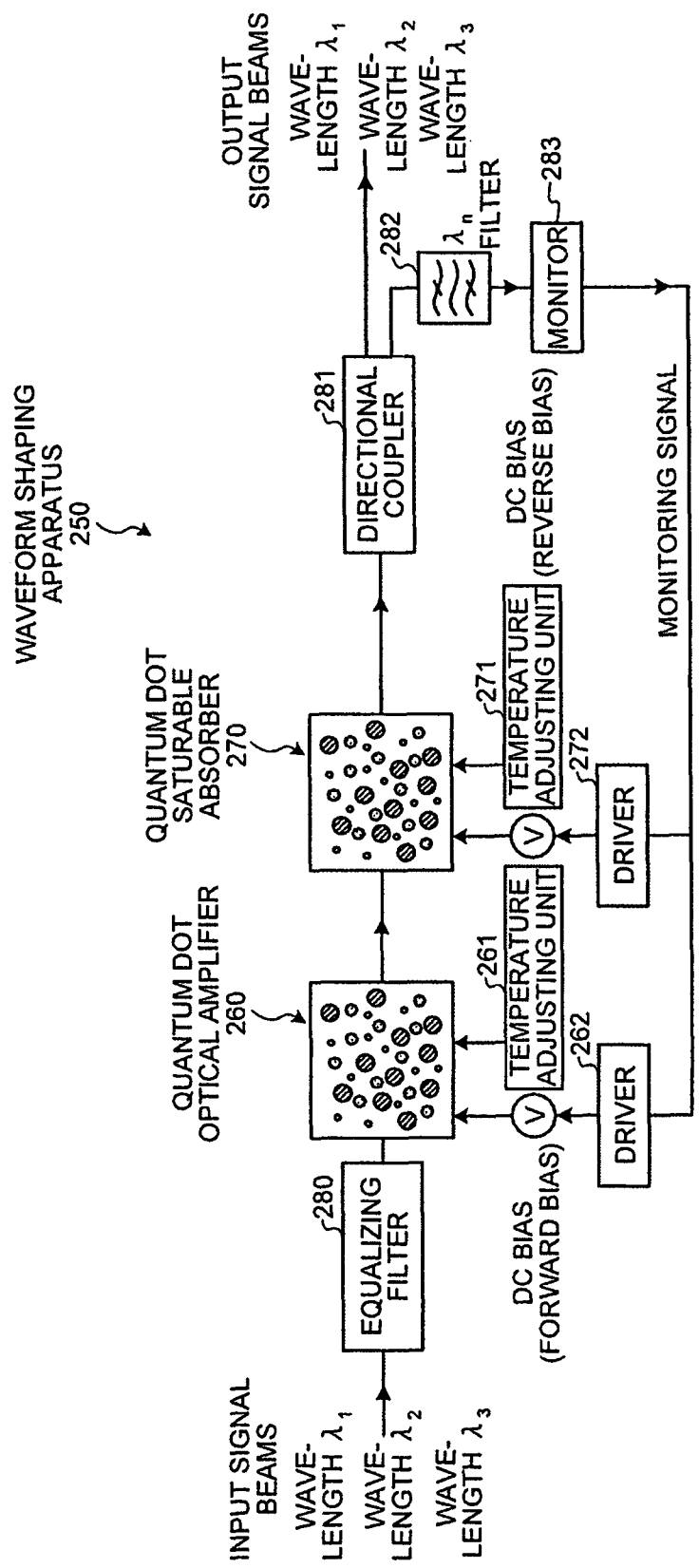
FIG. 10 is a schematic of a waveform shaping apparatus according to a third embodiment of the present invention.

A structure of the waveform shaping apparatus according to the third embodiment will be now explained. FIG. 10 is a schematic of a waveform shaping apparatus 250 according to the third embodiment. As shown in FIG. 10, the waveform shaping apparatus 250 includes a quantum dot optical amplifier 260, a quantum dot saturable absorber 270, temperature adjusting units 261 and 271, drivers 262 and 272, an equalizing filter 280, a directional coupler 281, a filter 282, and a monitor 283.

The quantum dot optical amplifier 260 corresponds to the quantum dot optical amplifier 50 explained in FIG. 2, and the forward bias is applied to the quantum dot optical amplifier 260. The quantum dot optical amplifier 260 is maintained at a predetermined temperature by the temperature adjusting unit 261.

The driver 262 obtains information about the signal quality (Q-factor) (hereinafter, "signal quality information") from the monitor 283, and adjusts the level of the forward bias applied to the quantum dot optical amplifier 260 to reduce the mark level noise (to keep the mark level noise within a threshold) based on the obtained signal quality information.

The quantum dot saturable absorber 270 corresponds to the quantum dot saturable absorber 60 explained in FIG. 3, and the reverse bias is applied to the quantum dot saturable absorber 270. The quantum dot saturable absorber 270 is maintained at a predetermined temperature by the temperature adjusting unit 271.

The driver 272 obtains signal quality information from the monitor 283, and adjusts the reverse bias applied to quantum dot saturable absorber 270 to reduce the space level noise (to keep the space level noise within a threshold) based on the obtained signal quality information.

The equalizing filter 280 is a filter (an equalizer) that adjusts the power of each of the wavelengths of the signal beams to a predetermined power, and corresponds to the equalizing filter 230 explained in FIG. 8.

The directional coupler 281 is an element that separates the signal beams by a predetermined ratio. In the example shown in FIG. 10, the directional coupler 281 separates the signal beams received from the quantum dot saturable absorber 270, inputs one of the separated beams into the filter 282, and outputs the other to outside.

The filter 282 is a filter that passes only predetermined wavelengths included in the signal beams input from the directional coupler 281. For example, the filter 282 passes only wavelengths $\lambda_1$, $\lambda_2$, and $\lambda_3$ from those included in the signal beams.

The monitor 283 measures the Q-factor from the signal beams input from the filter 282, and outputs information of the measured Q-factor to the drivers 262, 272 as signal quality information.

Figure 11:
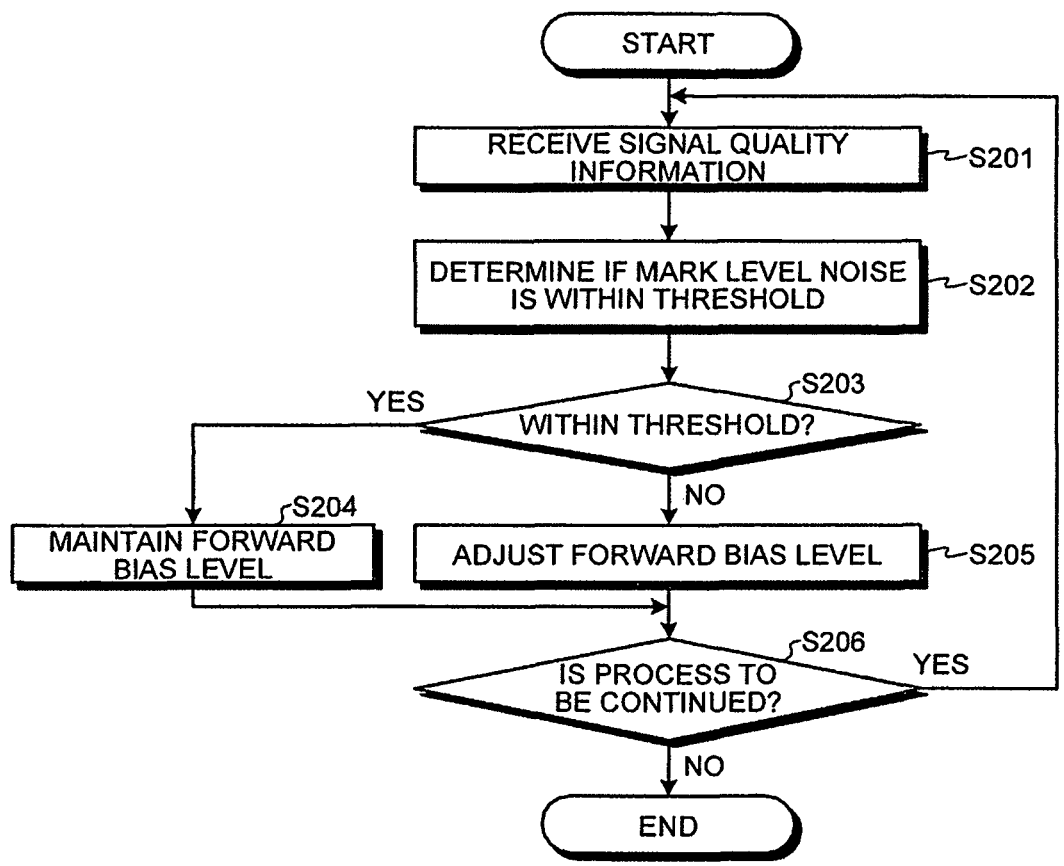
FIG. 11 is a flowchart of a process for adjusting a forward bias, performed by a driver according to the third embodiment.

A process performed by the driver 262, shown in FIG. 10, will be now explained. FIG. 11 is a flowchart of the process performed by the driver 262 according to the third embodiment to adjust the forward bias. As shown in FIG. 11, the driver 262 receives the signal quality information from the monitor 283 (step S201), and determines if the mark level noise is within a threshold (step S202).

If the mark level noise is within the threshold (YES at Step S203), the driver 262 maintains the level of the forward bias as it is (step S204), and the system control proceeds to a step S206, which will be described later.

If the mark level noise exceeds the threshold (NO at Step S203), the driver 262 adjusts the level of the forward bias (step S205). At the step 205, if the mark noise can be reduced by increasing the level of the forward bias, the driver 262 raises the level of the forward bias by a predetermined value. If the mark noise can be reduced by decreasing the level of the forward bias, the driver 262 reduces the level of the forward bias by a predetermined value.

If the driver 262 needs to continue adjusting the forward bias level (YES at Step S206), the system control returns to the step S201. To end adjusting the forward bias level (NO at Step S206), the process is ended.

Figure 12:
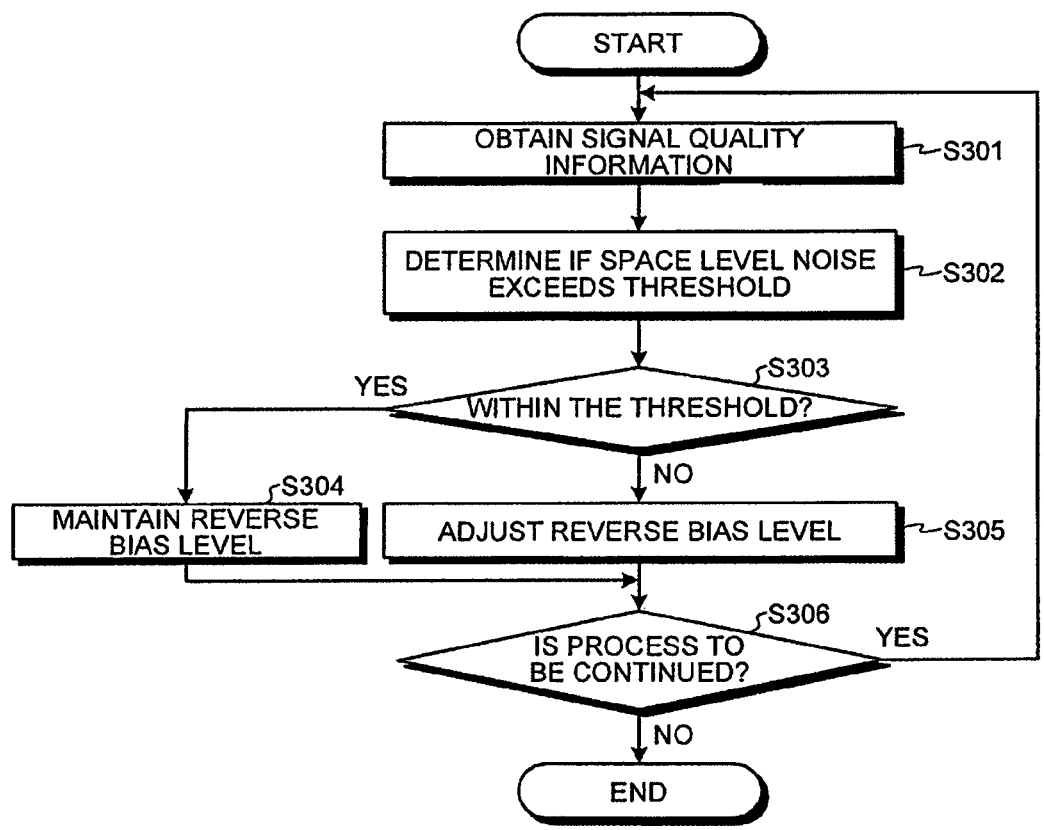
FIG. 12 is a flowchart of a process for adjusting a reverse bias, performed by another driver according to the third embodiment.

A process performed by the driver 272, shown in FIG. 10, will be now explained. FIG. 12 is a flowchart of the process performed by the driver 272 according to the third embodiment to adjust the reverse bias. As shown in FIG. 12, the driver 272 receives the signal quality information from the monitor 283 (step S301), and determines if the space level noise is within a threshold (step S302).

If the space level noise is within the threshold (YES at Step S303), the driver 272 maintains the level of the reverse bias as it is (step S204), and the system control proceeds to a step S306, which will be described later.

If the space level noise exceeds the threshold (NO at Step S303), the driver 272 adjusts the level of the reverse bias (step S305). At the step S305, if the space noise can be reduced by increasing the absolute value of the level of the reverse bias, the driver 272 increases the absolute value of the level of the reverse bias by a predetermined degree. If the space noise can be reduced by reducing the absolute value of the level of the reverse bias, the driver 272 reduces the absolute value of the level of the reverse bias by a predetermined degree.

If the driver 272 needs to continue adjusting the reverse bias level (YES at Step S306), the system control returns to the step S301. To end adjusting the reverse bias level (NO at Step S306), the process is ended.

As described above, in the waveform shaping apparatus 250 according to the third embodiment, the signal beams are input to the equalizing filter 280, and the equalizing filter 280 adjusts the power of each of the wavelengths of the signal beams. After the power of each of the wavelengths included therein is adjusted, the signal beams are input to the quantum dot optical amplifier 260 and the quantum dot saturable absorber 270, and the waveform shaping is provided therein. Furthermore, the signal beams output from the quantum dot saturable absorber 270 are monitored to adjust the forward bias and reverse bias applied to the quantum dot optical amplifier 260 and the quantum dot saturable absorber 270, respectively. Therefore, more precise waveform shaping can be provided to the signal beams.

In the waveform shaping apparatus 250 according to the third embodiment, the positions of the quantum dot optical amplifier 260 and the quantum dot saturable absorber 270 shown in FIG. 10 may be switched.

A general outline and characteristics of a waveform shaping apparatus according to a fourth embodiment of the present invention will be now explained. The waveform shaping apparatus according to the fourth embodiment includes an optical amplifier for adjusting the power of the signal beams. The signal beams, with the power adjusted by the optical amplifier (for example, the signal beams are adjusted so that the mark level gain saturates), is input to the quantum dot optical amplifier and the quantum dot saturable absorber, and the waveform shaping are performed to the signal beams therein.

In other words, the waveform shaping apparatus according to the fourth embodiment can provide the waveform shaping precisely even to signal beams that cannot be well-shaped only by adjusting the biases, because the power of the signal beams is adjusted before inputting to the quantum dot optical amplifier and the quantum dot saturable absorber to be provided with the waveform shaping.

Figure 13:
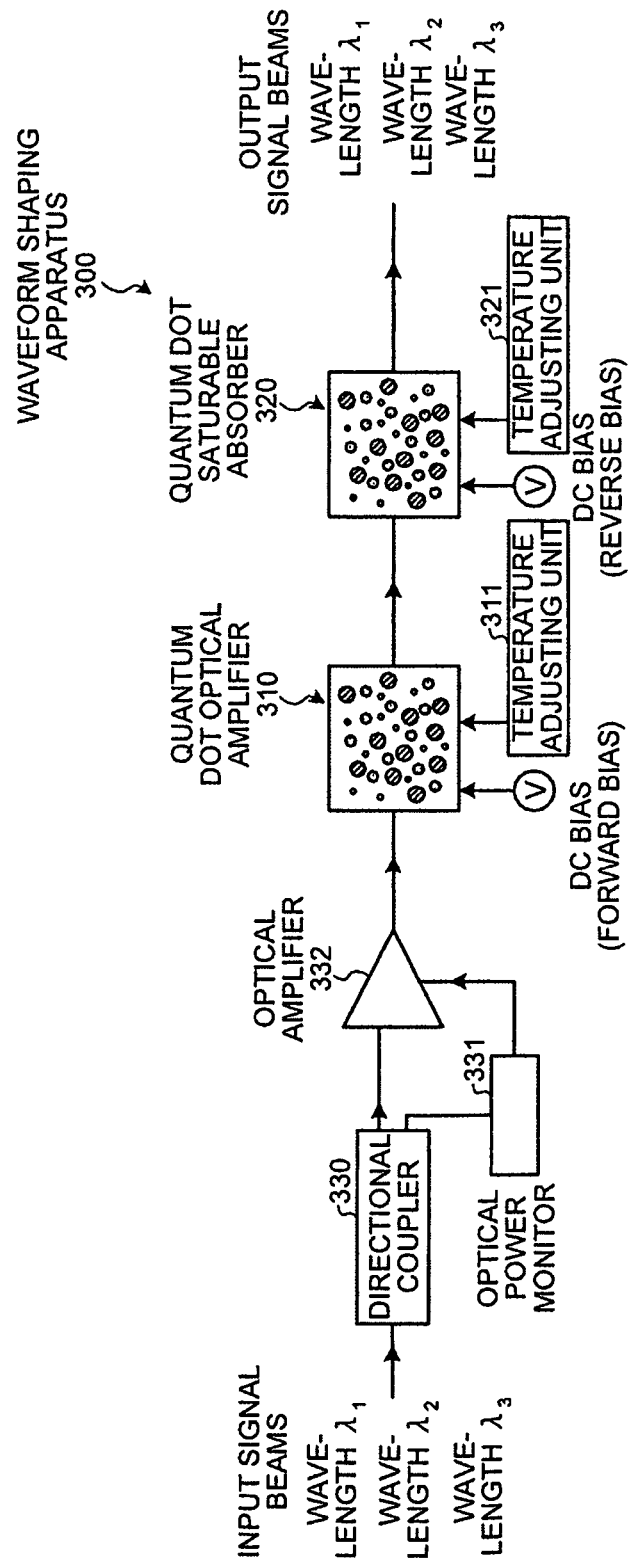
FIG. 13 is a schematic of a waveform shaping apparatus according to a fourth embodiment of the present invention.

A general outline and characteristics of the waveform shaping apparatus according to the fourth embodiment will be now explained. FIG. 13 is a schematic of a waveform shaping apparatus 300 according to the fourth embodiment. As shown in FIG. 13, the waveform shaping apparatus 300 includes a quantum dot optical amplifier 310, a quantum dot saturable absorber 320, temperature adjusting units 311 and 321, a directional coupler 330, an optical power monitor 331, and an optical amplifier 332.

The quantum dot optical amplifier 310 corresponds to the quantum dot optical amplifier 50 explained in FIG. 2, and the forward bias is applied to the quantum dot optical amplifier 310. The quantum dot optical amplifier 310 is maintained at a predetermined temperature by the temperature adjusting unit 331.

The quantum dot saturable absorber 320 corresponds to the quantum dot saturable absorber 60 explained in FIG. 3, and the reverse bias is applied to the quantum dot saturable absorber 320. The quantum dot saturable absorber 320 is maintained at a predetermined temperature by the temperature adjusting unit 321.

The directional coupler 330 is an element that separates the signal beams by a predetermined ratio. In the example shown in FIG. 13, the directional coupler 330 separates the signal beams input from the outside, and outputs one of the separated beams to the optical power monitor 331, and the other to the optical amplifier 332.

Figure 14:
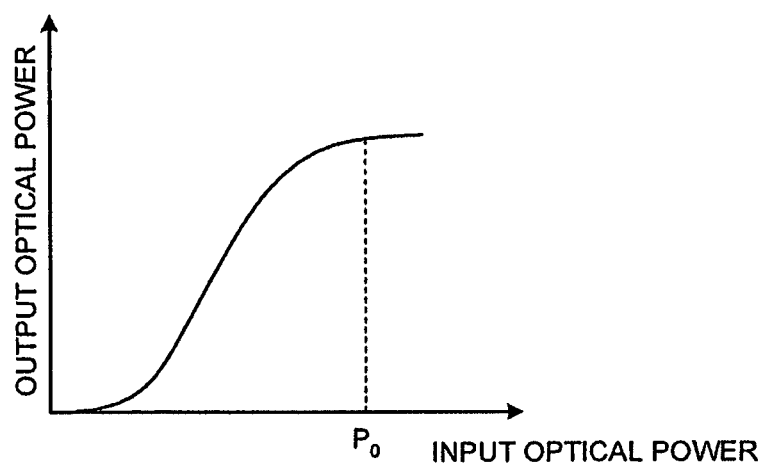
FIG. 14 is a graph for explaining the relationship between the input optical power and the output optical power.

The optical power monitor 331 measures the power of the signal beams input from the directional coupler 330, and adjusts the optical amplifier 332, so that the power of the signal beams input to the optical amplifier 332 from the directional coupler 330 (hereinafter, "input optical power") and the power of the signal beams output from the optical amplifier 332 (hereinafter, "output optical power") will be in the relationship as shown in FIG. 14 (that is, the power of the signal beams is adjusted so that the mark level gain of the signal beams saturates). FIG. 14 is a graph for showing the relationship between the input optical power and the output optical power.

The optical amplifier 332 amplifies the signal beams input from the directional coupler 330 based on a control signal output from the optical power monitor 331, and outputs the amplified signal beams to the quantum dot optical amplifier 310. If the control signal includes a command to increase the amplification factor, the optical amplifier 332 increases the amplification factor for the signal beams by a predetermined ratio. If the control signal includes a command to reduce the amplification factor, the optical amplifier 332 reduces the amplification factor for the signal beams by a predetermined ratio.

As described above, the waveform shaping apparatus 300 according to the fourth embodiment includes the optical amplifier 332 that adjusts the power of the signal beams. After the power thereof is adjusted (for example, adjusted so that the mark level gain saturates), the signal beams are input to the quantum dot optical amplifier 310 and the quantum dot saturable absorber 320, and provided with the waveform shaping therein. Therefore, more precise waveform shaping can be provided even to signal beams that cannot be shaped well only by adjusting the biases.

In the waveform shaping apparatus 300 according to the fourth embodiment, the positions of the quantum dot optical amplifier 310 and the quantum dot saturable absorber 320 shown in FIG. 13 may be switched. Moreover, an erbium doped fiber amplifier (EDFA) or a QD amplifier (a linear amplifier) may be used for the optical amplifier 332. Furthermore, an OE may be used for the optical power monitor 331.

A general outline and characteristics of a waveform shaping apparatus according to a fifth embodiment of the present invention will be now explained. The waveform shaping apparatus according to the fifth embodiment includes an optical amplifier that adjusts the power of the signal beams (adjusts so that the mark level gain of the signal beams saturates, for example), and a filter that adjusts the power of each of the wavelengths of the signal beams. The signal beams, having the power thereof amplified by the optical amplifier and the power of each of the wavelengths included therein adjusted by the filter, are input to the quantum dot optical amplifier and the quantum dot saturable absorber, and the waveform shaping are performed therein.

As described above, in the waveform shaping apparatus according to the fifth embodiment, after the optical amplifier adjusts the power of the signal beams and the filter adjusts the power of each of the wavelengths included in the signal beams, the signal beams are input to the quantum dot optical amplifier and the quantum dot saturable absorber to be provided with the waveform shaping therein. Therefore, more precise waveform shaping can be provided to the signal beams.

Figure 15:
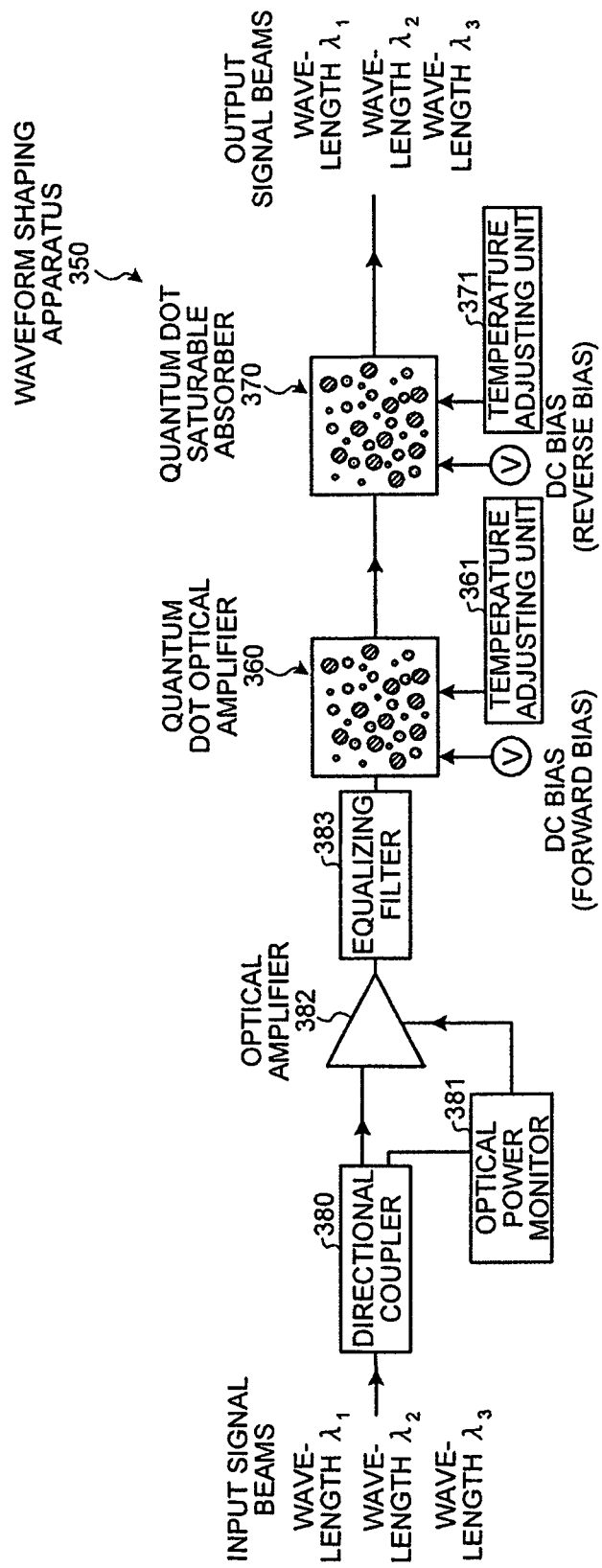
FIG. 15 is a schematic of a waveform shaping apparatus according to a fifth embodiment of the present invention.

A general structure of the waveform shaping apparatus according to the fifth embodiment will be now explained. FIG. 15 is a schematic of a waveform shaping apparatus 350 according to the fifth embodiment. As shown in FIG. 15, the waveform shaping apparatus 350 includes a quantum dot optical amplifier 360, a quantum dot saturable absorber 370, temperature adjusting units 361 and 371, a directional coupler 380, an optical power monitor 381, an optical amplifier 382, and an equalizing filter 383.

The quantum dot optical amplifier 360 corresponds to the quantum dot optical amplifier 50 explained in FIG. 2, and the forward bias is applied to the quantum dot optical amplifier 360. The quantum dot optical amplifier 360 is maintained at a predetermined temperature by the temperature adjusting unit 361.

The quantum dot saturable absorber 370 corresponds to the quantum dot saturable absorber 60 explained in FIG. 3, and the reverse bias is applied to the quantum dot saturable absorber 370. The quantum dot saturable absorber 370 is maintained at a predetermined temperature by the temperature adjusting unit 371.

The directional coupler 380 is an element that separates the signal beams by a predetermined ratio. In the example shown in FIG. 15, the directional coupler 380 separates the signal beams input from the outside, and outputs one of the separated beams to the optical power monitor 381, and the other to the optical amplifier 382.

The optical power monitor 381 measures the power of the signal beams input from the directional coupler 380, and adjusts the optical amplifier 382, so that the power of the signal beams input to the optical amplifier 382 from the directional coupler 380 (hereinafter, "input optical power") and the power of the signal beams output from the optical amplifier 382 (hereinafter, "output optical power") will be in the relationship as shown in FIG. 14 (that is, adjusted so that the mark level gain of the signal beams saturates).

The optical amplifier 382 amplifies the signal beams input from the directional coupler 380 based on a control signal output from the optical power monitor 381, and outputs the amplified signal beams to the equalizing filter 383. If the control signal includes a command to increase the amplification factor, the optical amplifier 382 increases the amplification factor for the signal beams by a predetermined ratio. If the control signal includes a command to reduce the amplification factor, the optical amplifier 382 reduces the amplification factor for the signal beams by a predetermined ratio.

The equalizing filter 383 is a filter (an equalizer) that adjusts the power of each of the wavelengths of the signal beams to a predetermined value. For example, the equalizing filter 383 increases the power of each wavelengths $\lambda_1$, $\lambda_2$, and $\lambda_3$ (where, $\lambda_1 < \lambda_2 < \lambda_3$) input to the quantum dot optical amplifier 360 and the quantum dot saturable absorber 370, so that the power thereof becomes greater in the order of $\lambda_1$, $\lambda 2$, and $\lambda_3$ (see FIG. 9).

A degree by which the equalizing filter 383 should increase the power of each of the wavelengths depends on the characteristics of the waveform shaping performed by the quantum dot optical amplifier 360 and the quantum dot saturable absorber 370. Therefore, the administrator should find out a power most suitable for the waveform shaping performed by the quantum dot optical amplifier 360 and the quantum dot saturable absorber 370 for each of the wavelength in advance, for example through an experiment, and adjust the equalizing filter 383 so that each of the wavelengths is adjusted the most suitable power.

The signal beams input to the waveform shaping apparatus 350 are amplified at the optical amplifier 382 so that the mark level gain thereof saturates and are subsequently input into the equalizing filter 383, and the power of each of the wavelengths included therein are adjusted at the equalizing filter 383. After the power of each of the wavelengths is adjusted, the signal beams are input to the quantum dot optical amplifier 360, and the mark level noise is compressed therein. After the mark level compression, the signal beams are input to the quantum dot saturable absorber 370, and space level noise is compressed therein. In other words, by the signal beams going through the waveform shaping apparatus 200, the mark level noise and the space level noise included therein are compressed (the waveform of the signal beams is shaped).

As described above, the waveform shaping apparatus 350 according to the fifth embodiment includes the optical amplifier 382 that adjusts the power of the signal beams (for example, so that the mark level gains saturates), and the equalizing filter 383 that adjusts the power of each of the wavelengths of the signal beams. Because the signal beams are input to the quantum dot optical amplifier 360 and the quantum dot saturable absorber 370 to be provided with the waveform shaping after the optical amplifier 382 amplifies the power thereof, and the equalizing filter 383 adjusts the power of each wavelengths included therein, more precise waveform shaping can be provided to the signal beams.

In the waveform shaping apparatus 350 according to the fifth embodiment, the positions of the quantum dot optical amplifier 360 and the quantum dot saturable absorber 370 shown in FIG. 15 may be switched. Moreover, an erbium doped fiber amplifier (EDFA) or a QD amplifier (a linear amplifier) may be used for the optical amplifier 382. Furthermore, an OE may be used for the optical power monitor 381.

A general outline and characteristics of a waveform shaping apparatus according to a sixth embodiment of the present invention will be now explained. The waveform shaping apparatus according to the sixth embodiment includes an optical amplifier that adjusts the power of the signal beams (adjusts so that the mark level gain of the signal beams saturates, for example), and a filter (an attenuator) that adjusts (attenuates) the power of each of the wavelength included in the signal beams. The signal beams are input to the filter that attenuates the power of each of the wavelengths of the signal beams, after having the power thereof amplified by the optical amplifier and going through the quantum dot optical amplifier. The signal beams output from the filter is input to the quantum dot saturable absorber, and the waveform shaping is performed therein.

As described above, the waveform shaping apparatus according to the sixth embodiment includes the optical amplifier that amplifies the signal beam, and the filter, between the quantum dot optical amplifier and the quantum dot saturable absorber, that attenuates the power of each of the wavelengths of the signal beams. Therefore, more precise waveform shaping can be provided to the signal beams.

Figure 16:
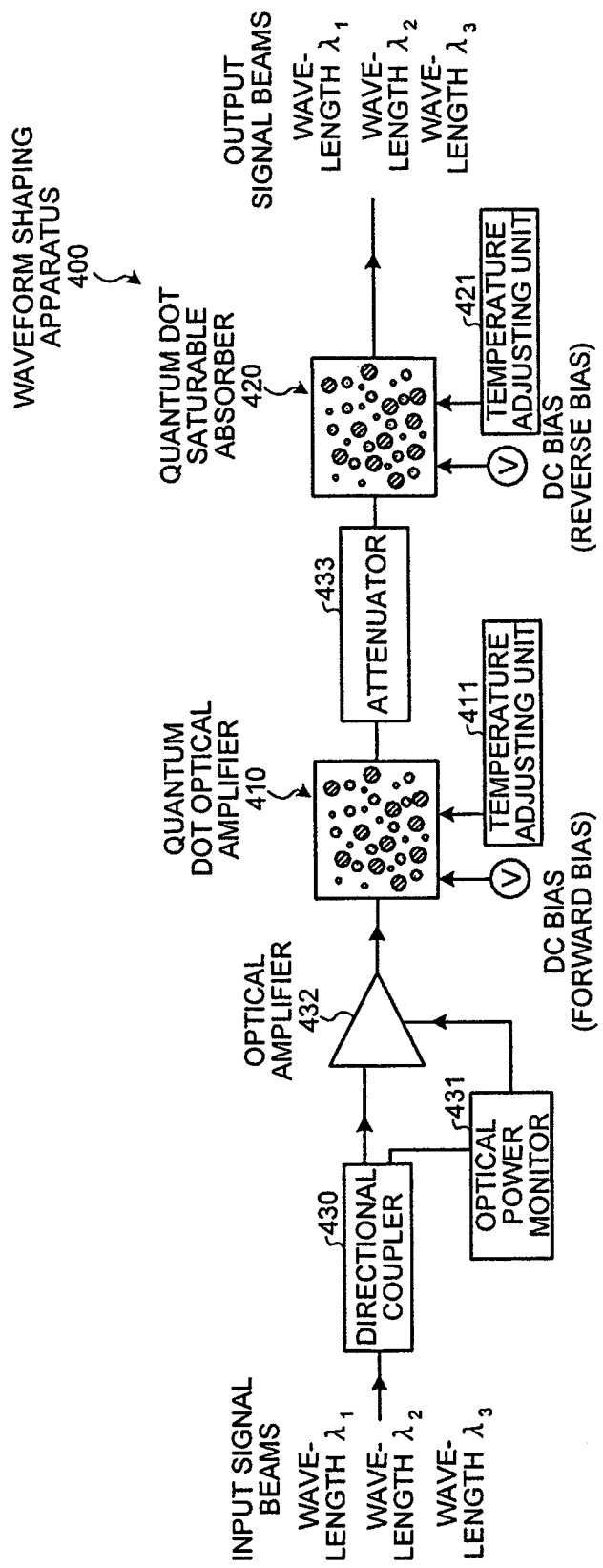
FIG. 16 is a schematic of a waveform shaping apparatus according to a sixth embodiment of the present invention.

A general structure of the waveform shaping apparatus according to the sixth embodiment will be now explained. FIG. 16 is a schematic of a waveform shaping apparatus 400 according to the sixth embodiment. As shown in FIG. 16, the waveform shaping apparatus 400 includes a quantum dot optical amplifier 410, a quantum dot saturable absorber 420, temperature adjusting units 411 and 421, a directional coupler 430, an optical power monitor 431, and an optical amplifier 432.

The quantum dot optical amplifier 410 corresponds to the quantum dot optical amplifier 50 explained in FIG. 2, and the forward bias is applied to the quantum dot optical amplifier 410. The quantum dot optical amplifier 410 is maintained at a predetermined temperature by the temperature adjusting unit 411.

The quantum dot saturable absorber 420 corresponds to the quantum dot saturable absorber 60 explained in FIG. 3, and the reverse bias is applied to the quantum dot saturable absorber 420. The quantum dot saturable absorber 420 is maintained at a predetermined temperature by the temperature adjusting unit 421.

The directional coupler 430 is an element that separates the signal beams by a predetermined ratio. In the example shown in FIG. 16, the directional coupler 430 separates the signal beams input from the outside, and inputs one of the separated beams into the optical power monitor 431, and the other into the optical amplifier 432.

The optical power monitor 431 measures the power of the signal beams input from the directional coupler 430, and adjusts the optical amplifier 432, so that the power of the signal beams input to the optical amplifier 432 from the directional coupler 430 (hereinafter, "input optical power") and the power of the signal beams output from the optical amplifier 432 (hereinafter, "output optical power") will be in the relationship as shown in FIG. 14 (that is, adjusted so that the mark level gain of the signal beams saturates).

The optical amplifier 432 amplifies the signal beams input from the directional coupler 430 based on a control signal output from the optical power monitor 431, and outputs the amplified signal beams to the quantum dot optical amplifier 410. If the control signal includes a command to increase the amplification factor, the optical amplifier 432 increases the amplification factor for the signal beams by a predetermined ratio. If the control signal includes a command to reduce the amplification factor, the optical amplifier 432 reduces the amplification factor for the signal beams by a predetermined ratio.

An attenuator 433 adjusts the power of each of the wavelengths of the signal beams to a predetermined value. The attenuator 433 attenuates the power of each of the wavelengths of the signal beams to be input into the quantum dot saturable absorber 420 to a predetermined value.

A degree by which the attenuator 433 should increase the power of each of the wavelengths depends on the characteristics of the waveform shaping performed by the quantum dot saturable absorber 420. Therefore, the administrator should find out a power most suitable for the waveform shaping performed by the quantum dot saturable absorber 420 for each of the wavelength in advance, for example through an experiment, and adjust the equalizing attenuator 433 so that each of the wavelengths is adjusted the most suitable power.

The signal beams input to the waveform shaping apparatus 400 are amplified at the optical amplifier 432 so that the mark level gain thereof saturates and are subsequently input into the quantum dot optical amplifier 410, and the mark level waveform shaping is provided by the quantum dot optical amplifier 410. At the following step, the attenuator 433 attenuates the power of each of the wavelengths of the signal beams. The attenuated signal beams are output to the quantum dot saturable absorber 420, and the space level waveform shaping is provided therein.

As described above, the waveform shaping apparatus 400 according to the sixth embodiment includes the optical amplifier 432 that adjusts the power of the signal beams (for example, so that the mark level gain saturates), and the attenuator 433 that adjusts (attenuates) the power of each of the wavelengths of the signal beams. Because the signal beams are input to the quantum dot saturable absorber 420 for the waveform shaping after the optical amplifier 432 amplifies the power thereof to input into the quantum dot optical amplifier 410 and the attenuator 433 attenuates the power of each wavelength included therein, more precise waveform shaping can be provided to the signal beams.

An erbium doped fiber amplifier (EDFA) or a QD amplifier (a linear amplifier) may be used for the optical amplifier 432 according to the sixth embodiment. Furthermore, an OE may be used for the optical power monitor 431.

A general outline and characteristics of a waveform shaping apparatus according to a seventh embodiment of the present invention will be now explained. The waveform shaping apparatus according to the seventh embodiment includes a monitor that monitors, for example, a Q-factor of the signal beams output from the optical amplifier and the quantum dot saturable absorber, and adjusts the power of the signal beams to be input to the quantum dot optical amplifier so that the Q-factor will be a within a threshold.

As described above, the waveform shaping apparatus according to the seventh embodiment adjusts the power of the signal beams to be input to the quantum dot optical amplifier so that the Q-factor of the signal beams output from the quantum dot saturable absorber will be a within a threshold. Therefore, more precise waveform shaping can be provided to the signal beams.

Figure 17:
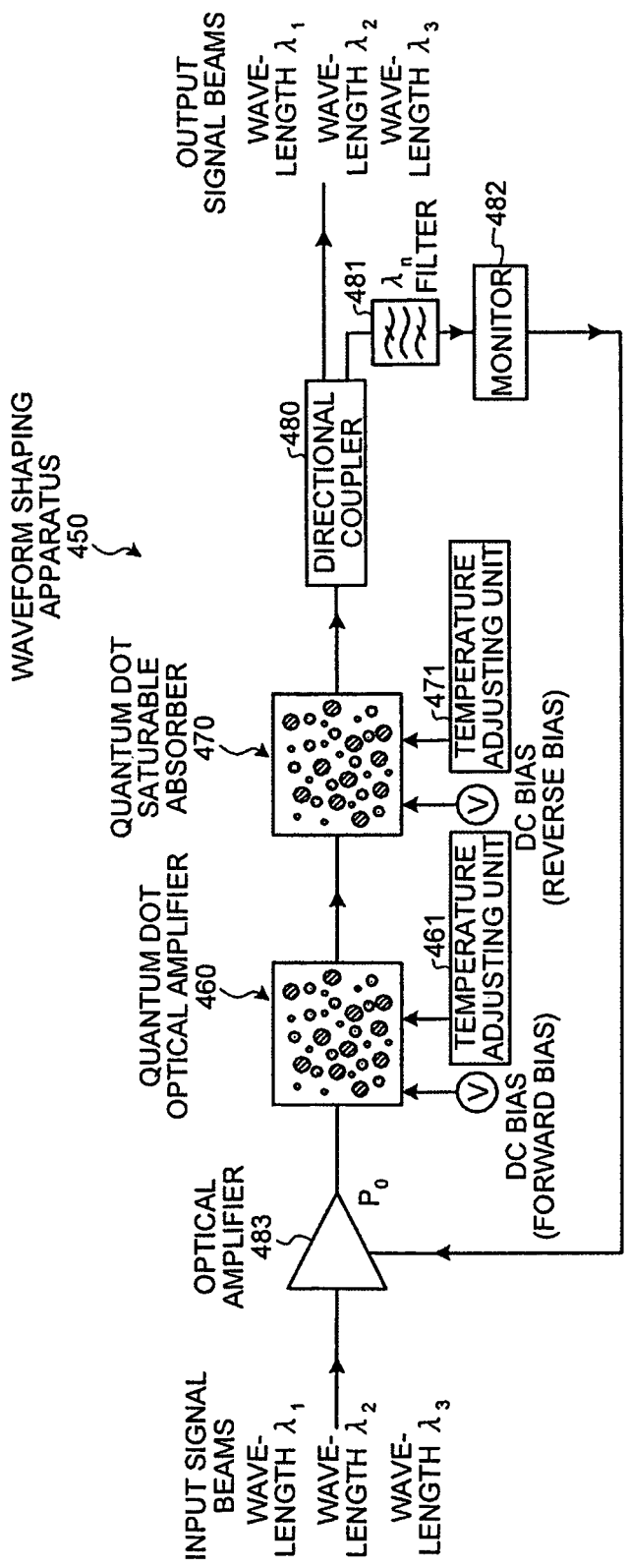
FIG. 17 is a schematic of a waveform shaping apparatus according to a seventh embodiment of the present invention.

A general structure of the waveform shaping apparatus according to the seventh embodiment will be now explained. FIG. 17 is a schematic of a waveform shaping apparatus 450 according to the seventh embodiment. As shown in FIG. 17, the waveform shaping apparatus 450 includes a quantum dot optical amplifier 460, temperature adjusting units 461 and 471, a quantum dot saturable absorber 470, a directional coupler 480, a filter 481, a monitor 482, and an optical amplifier 483.

The quantum dot optical amplifier 460 corresponds to the quantum dot optical amplifier 50 explained in FIG. 2, and the forward bias is applied to the quantum dot optical amplifier 460. The quantum dot optical amplifier 460 is maintained at a predetermined temperature by the temperature adjusting unit 461.

The quantum dot saturable absorber 470 corresponds to the quantum dot saturable absorber 60 explained in FIG. 3, and the reverse bias is applied to the quantum dot saturable absorber 470. The quantum dot saturable absorber 470 is maintained at a predetermined temperature by the temperature adjusting unit 471.

The directional coupler 480 is an element that separates the signal beams by a predetermined ratio. In the example shown in FIG. 17, the directional coupler 480 separates the signal beams input from the outside, inputs one of the separated beams into the filter 481, and outputs the other to outside.

The filter 481 is a filter that passes only predetermined wavelengths included in the signal beams input from the directional coupler 480. For example, the filter 481 passes only wavelengths $\lambda_1$, $\lambda_2$, and $\lambda_3$ from those included in the signal beams.

The monitor 482 measures the Q-factor from the signal beams input from the filter 481, and adjusts the amplification factor of the optical amplifier 483 to keep the measured Q-factor within a threshold. If the Q-factor decreases by increasing the amplification factor of the optical amplifier 483, the monitor 482 increases the amplification factor of the optical amplifier 483 by a predetermined ratio. If the Q-factor decreases by decreasing the amplification factor of the optical amplifier 483, the monitor 482 decreases the amplification factor of the optical amplifier 483 by a predetermined ratio.

The optical amplifier 483 changes the amplification factor thereof in response to the control signal output from the monitor 482, and amplifies the signal beams input from the outside.

As described above, the waveform shaping apparatus 450 according to the seventh embodiment includes the monitor 482 that monitors the Q-factor of the signal beams output from the quantum dot optical amplifier 460 and the quantum dot saturable absorber 470, and adjusts the power of the signal beams input to the quantum dot optical amplifier at the optical amplifier 483 to keep the Q-factor within the threshold. Therefore, more precise waveform shaping can be provided to the signal beams.

In the waveform shaping apparatus 450 according to the seventh embodiment, the positions of the quantum dot optical amplifier 460 and the quantum dot saturable absorber 470 shown in FIG. 17 may be switched. Moreover, an erbium doped fiber amplifier (EDFA) or a QD amplifier (a linear amplifier) may be used for the optical amplifier 483. Furthermore, an OE may be used for the optical power monitor 381. In addition, an attenuator can be provided between the quantum dot optical amplifier 460 and the quantum dot saturable absorber 470 (see FIG. 16).

A general outline and characteristics of a waveform shaping apparatus according to an eighth embodiment of the present invention will be now explained. The waveform shaping apparatus according to the eighth embodiment includes an optical amplifier that adjusts the power of the signal beams. The signal beams, with the power adjusted by the optical amplifier, are input to the quantum dot optical amplifier and the quantum dot saturable absorber. The waveform shaping apparatus also monitors the signal beams output from the quantum dot saturable absorber, adjusts the biases applied to the quantum dot optical amplifier and the quantum dot saturable absorber, respectively, and also adjusts the amplification factor of the optical amplifier.

As described above, the waveform shaping apparatus according to the eighth embodiment includes the optical amplifier that adjusts the power of the signal beams, and also able to adjust the biases applied to a quantum dot optical amplifier 510 and a quantum dot saturable absorber 520, respectively. Therefore, more precise waveform shaping can be provided to the signal beams.

Figure 18:
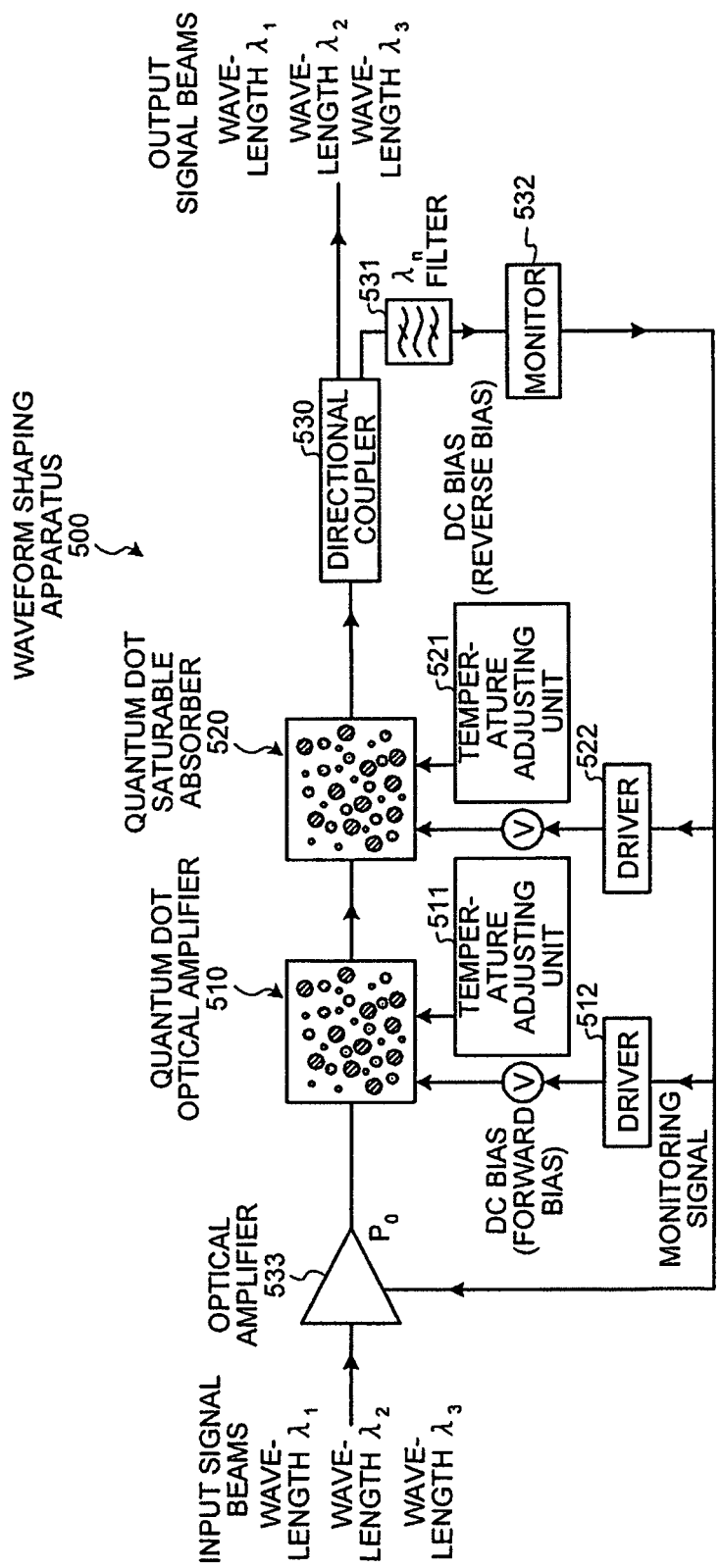
FIG. 18 is a schematic of a waveform shaping apparatus according to an eighth embodiment of the present invention.

A general structure of the waveform shaping apparatus according to the eighth embodiment will be now explained. FIG. 18 is a schematic of a waveform shaping apparatus 500 according to the eighth embodiment. As shown in FIG. 18, the waveform shaping apparatus 500 includes the quantum dot optical amplifier 510, temperature adjusting units 511 and 521, drivers 512 and 522, a quantum dot saturable absorber 520, a directional coupler 530, a filter 531, a monitor 532, and an optical amplifier 533.

The quantum dot optical amplifier 510 corresponds to the quantum dot optical amplifier 50 explained in FIG. 2, and the forward bias is applied to the quantum dot optical amplifier 510. The quantum dot optical amplifier 510 is maintained at a predetermined temperature by the temperature adjusting unit 511.

The driver 512 obtains information about the signal quality (Q-factor) from the monitor 532, and adjusts the forward bias applied to the quantum dot optical amplifier 510 to reduce the mark level noise based on the obtained signal quality information.

The quantum dot saturable absorber 520 corresponds to the quantum dot saturable absorber 60 explained in FIG. 3, and the reverse bias is applied to the quantum dot saturable absorber 520. The quantum dot saturable absorber 520 is maintained at a predetermined temperature by the temperature adjusting unit 521.

The driver 522 obtains signal quality information from the monitor 532, and adjusts the reverse bias applied to the quantum dot saturable absorber 520 to reduce the space level noise (to keep the space level noise within a threshold) based on the obtained signal quality information.

The directional coupler 530 is an element that separates the signal beams by a predetermined ratio. In the example shown in FIG. 18, the directional coupler 530 separates the signal beams input from the quantum dot saturable absorber 520, inputs one of the separated beams into the filter 531, and outputs the other to outside.

The filter 531 is a filter that passes only predetermined wavelengths included in the signal beam input from the directional coupler 530. For example, the filter 531 passes only wavelengths $\lambda_1$, $\lambda_2$, and $\lambda_3$ from those included in the signal beam.

The monitor 532 measures the Q-factor from the signal beams input from the filter 531, and outputs the measured Q-factor to the drivers 512 and 522 as the quality information. The monitor 532 also adjusts the amplification factor of the optical amplifier 533 to keep the measured Q-factor within the threshold. If the Q-factor decreases by increasing the amplification factor of the optical amplifier 533, the monitor 532 increases the amplification factor of the optical amplifier 533 by a predetermined ratio. If the Q-factor decreases by decreasing the amplification factor of the optical amplifier 533, the monitor 532 decreases the amplification factor of the optical amplifier 533 by a predetermined ratio.

The optical amplifier 533 changes the amplification factor thereof in response to the control signal output from the monitor 532, and amplifies the signal beams input from the outside.

Figure 19:
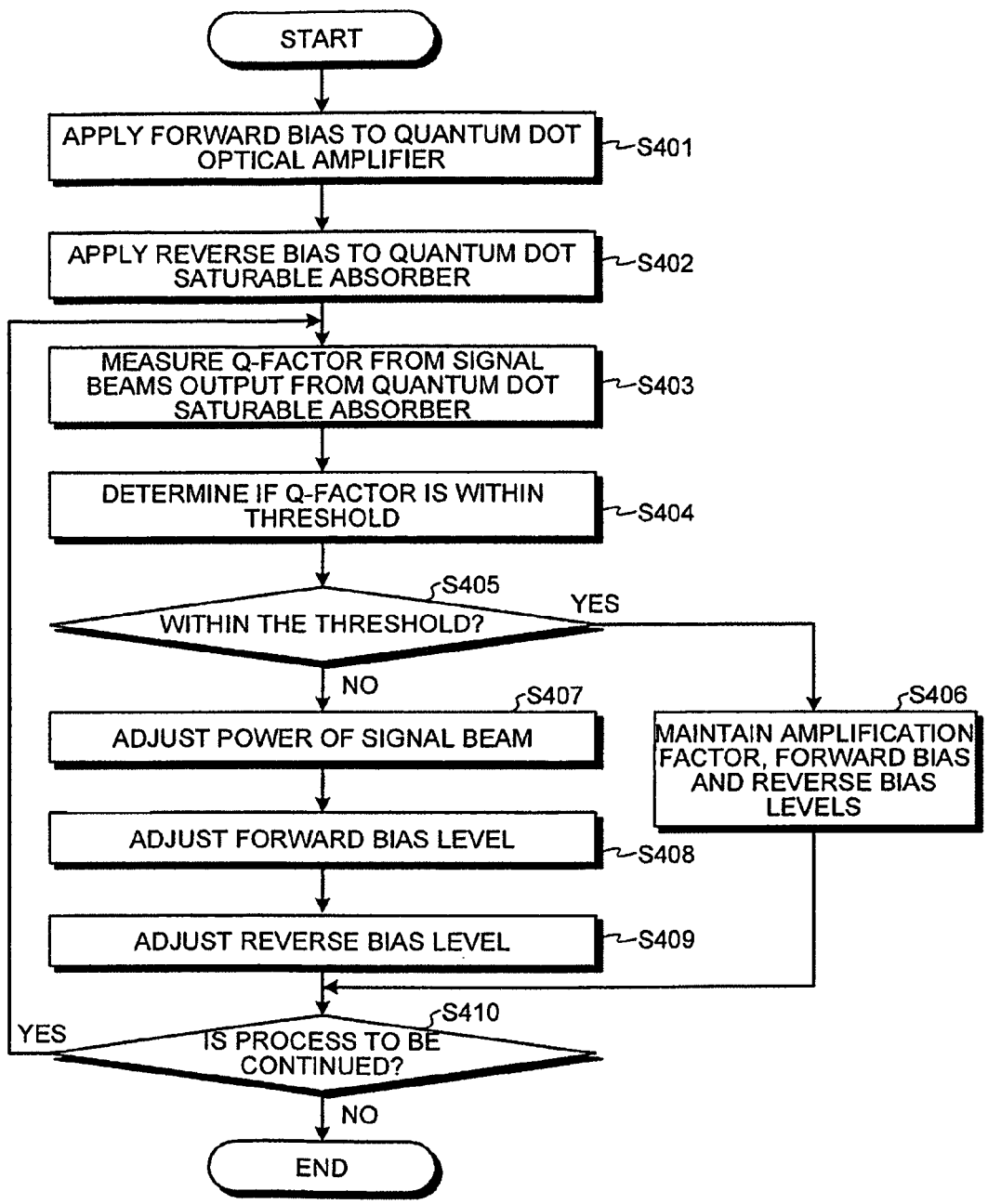
FIG. 19 is a flowchart of process performed by the waveform shaping apparatus according to the eighth embodiment.

A process performed by the waveform shaping apparatus 500 according to the eighth embodiment will be now explained. FIG. 19 is a flowchart of the process performed by the waveform shaping apparatus according to the eighth embodiment. As shown in FIG. 19, the driver 512 in the waveform shaping apparatus 500 applies a constant forward bias to the quantum dot optical amplifier 510 (step S401), and the driver 522 therein applies a constant reverse bias to the quantum dot saturable absorber 520 (step S402).

The monitor 532 obtains the signal beams output from the quantum dot saturable absorber 520 via the directional coupler 530 and the filter 531, measures the Q-factor thereof (step S403), and determines if the Q-factor is within the threshold (step S404).

If the Q-factor is within the threshold (YES at Step S405), the amplification factor of the optical amplifier 538, the levels of the forward bias and the reverse bias applied to the quantum dot optical amplifier 510 and the quantum dot saturable absorber 520, respectively, are maintained as they are (step S406), and the system control proceeds to a step S410, which will be described later.

If the Q-factor is not within the threshold (NO at Step S405), the amplification factor of the optical amplifier 533 is adjusted (step S407), the level of the forward bias applied to the quantum dot optical amplifier 510 is adjusted (step S408), and the level of the reverse bias applied to the quantum dot saturable absorber 520 is adjusted (step S409).

If the waveform shaping apparatus 500 is to continue the process (YES at Step S410), the system control returns to the step S403. If not (NO at Step S410), the process is ended.

As described above, the waveform shaping apparatus 500 according to the eighth embodiment includes the optical amplifier 533 that adjusts the power of the signal beams. Then, the signal beams, with the power adjusted by the optical amplifier 533, are input to the quantum dot optical amplifier 510 and the quantum dot saturable absorber 520. The waveform shaping apparatus 500 also monitors the signal beams output from the quantum dot saturable absorber 520, adjusts the biases applied to the quantum dot optical amplifier 510 and the quantum dot saturable absorber 520, respectively, and also adjusts the amplification factor of the optical amplifier 533. Therefore, more precise waveform shaping can be provided to the signal beams.

In the waveform shaping apparatus 500 according to the eighth embodiment, the positions of the quantum dot optical amplifier 510 and the quantum dot saturable absorber 520 shown in FIG. 18 may be switched. Moreover, an erbium doped fiber amplifier (EDFA) or a QD amplifier (a linear amplifier) may be used for the optical amplifier 533. Furthermore, an attenuator can be provided between the quantum dot optical amplifier 510 and the quantum dot saturable absorber 520 (see FIG. 16).

A general outline and characteristics of a waveform shaping apparatus according to a ninth embodiment of the present invention will be now explained. The waveform shaping apparatus according to the ninth embodiment compresses the pulse width of the signal beams to bring down cross points (cross points of eye-patterns) in advance. The signal beams with the lowered cross points are input to the quantum dot optical amplifier and quantum dot saturable absorber, and the waveform shaping is performed therein.

Figure 20:
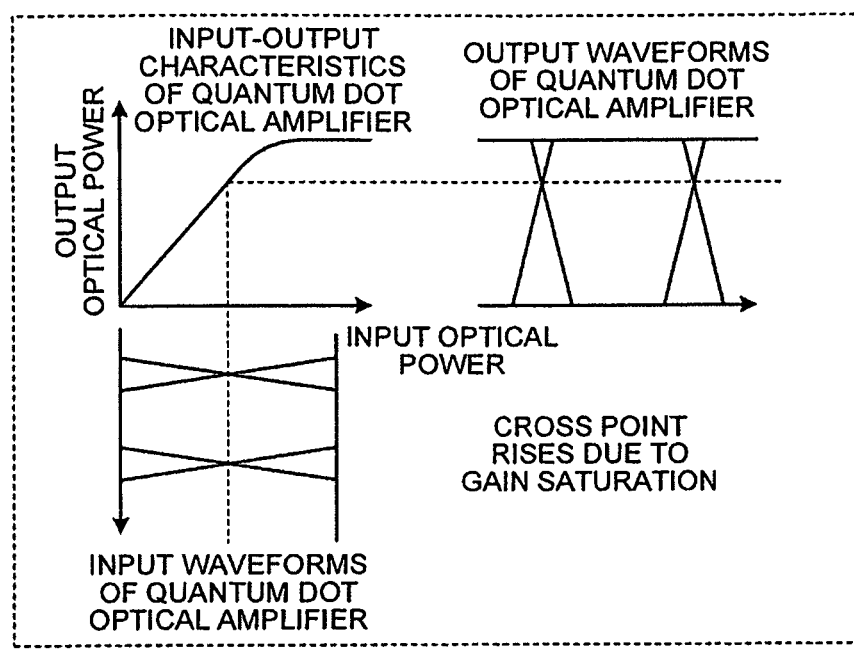
FIG. 20 is a schematic for explaining output characteristics of a quantum dot optical amplifier.

FIG. 20 is a schematic for explaining output characteristics of the quantum dot optical amplifier. As shown in FIG. 20, if the mark level gain of the quantum dot optical amplifier saturates, the cross point of the signal beam output therefrom becomes higher than that of the signal beam input thereto.

Even if the cross point becomes higher in the quantum dot optical amplifier, the cross point can be brought down by the space level absorption saturation performed by the quantum dot saturable absorber. However, if the absorption saturation has any limitation, the cross point cannot be brought down to a desirable level. If this situation applies, the rising of the cross point due to the gain saturation in the quantum dot optical amplifier can be suppressed by compressing the pulse width of the signal beam and bringing down the cross point in advance. In this manner, the waveform shaping can be performed more precisely. The pulse widths can be compressed by interaction between non-linear effect and anomalous dispersion (for example, a know technology, such as soliton compression, can be used).

Furthermore, the waveform shaping apparatus according to the ninth embodiment includes the optical amplifier that adjusts the power of the signal beams and the attenuator that attenuates the power of the signal beams to perform the waveform shaping of the signal beams more precisely.

Figure 21:
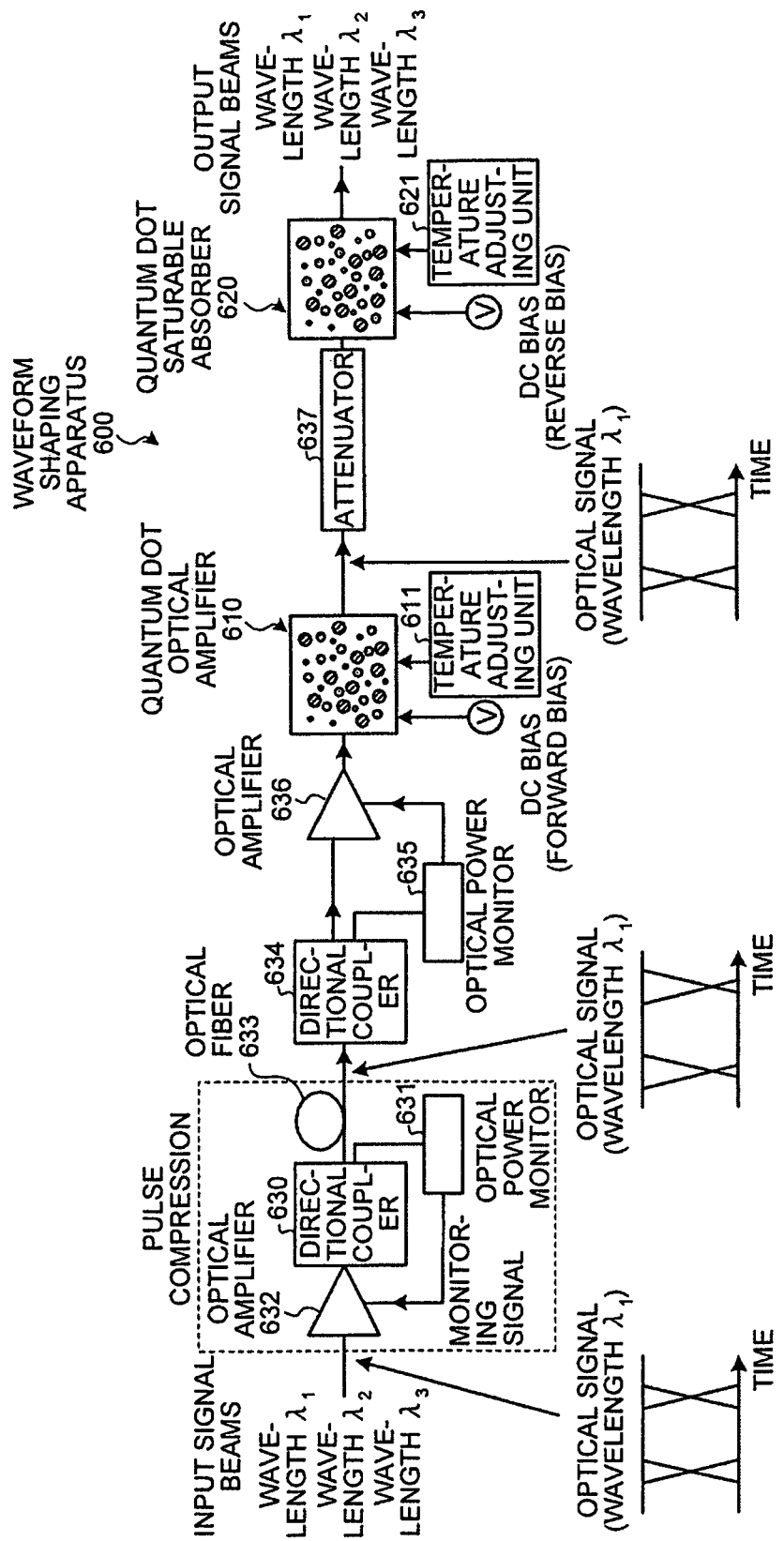
FIG. 21 is a schematic of a waveform shaping apparatus according to a ninth embodiment of the present invention.

A general structure of the waveform shaping apparatus according to the ninth embodiment will be now explained. FIG. 21 is a schematic of a waveform shaping apparatus 600 according to the ninth embodiment. As shown in FIG. 21, the waveform shaping apparatus 600 includes a quantum dot optical amplifier 610, temperature adjusting units 611 and 621, a quantum dot saturable absorber 620, optical amplifiers 632 and 636, directional couplers 630 and 634, optical power monitors 631 and 635, and an optical fiber 633.

The quantum dot optical amplifier 610 corresponds to the quantum dot optical amplifier 50 explained in FIG. 2, and the forward bias is applied to the quantum dot optical amplifier 610. The quantum dot optical amplifier 610 is maintained at a predetermined temperature by the temperature adjusting unit 611.

The quantum dot saturable absorber 620 corresponds to the quantum dot saturable absorber 60 explained in FIG. 3, and the reverse bias is applied to the quantum dot saturable absorber 620. The quantum dot saturable absorber 620 is maintained at a predetermined temperature by the temperature adjusting unit 621.

The directional coupler 630 is an element that separates the signal beams by a predetermined ratio. In the example shown in FIG. 21, the directional coupler 630 separates the signal beams input from the optical amplifier 632, and inputs one of the separated beams into the optical fiber 633, and the other to the optical power monitor 631.

The optical power monitor 631 monitors the signal beams input from the directional coupler 630, and adjusts the amplification factor of the optical amplifier 632 so that the power of the signal beams is adjusted to a level where the pulse width thereof is compressed. The administrator should conduct a research on the relationship between the power of the signal beams going through the optical fiber 633 and the compression of the pulse in advance, for example, through an experiment, and set the power of the signal beams to the optical power monitor 631 so that the pulse width thereof is compressed. In other words, the optical power monitor 631 adjusts the amplification factor of the optical amplifier 632 so that the power of the signal beams will be adjusted to the predefined value.

The optical amplifier 632 changes the amplification factor thereof in response to the control signal output from the optical power monitor 631, and amplifies the signal beams input from the outside. The optical fiber 633 is not only a medium that transfers the signal beams, but also a non-linear element with anomalous dispersion property (for example, a normal dispersion fiber (SMF)).

In summary, the pulse width of the signal beams is compressed by the directional coupler 630, the optical power monitor 631, the optical amplifier 632, and the optical fiber 633.

The directional coupler 634 is an element that separates the signal beams by a predetermined ratio. In the example shown in FIG. 21, the directional coupler 634 separates the signal beams input from the outside, and outputs one of the separated beams to the optical power monitor 635, and the other to the optical amplifier 636.

The optical power monitor 635 measures the power of the signal beams input from the directional coupler 634, and adjusts the optical amplifier 636, so that the power of the signal beams input to the optical amplifier 636 from the directional coupler 634 (input optical power) and the power of the signal beams output from the optical amplifier 636 (output optical power) will be in the relationship as shown in FIG. 14 (that is, adjusted so that the mark level gain of the signal beam saturates).

The optical amplifier 636 amplifies the signal beams input from the directional coupler 634 based on a control signal output from the optical power monitor 635, and outputs the amplified signals to the quantum dot optical amplifier 610. If the control signal includes a command to increase the amplification factor, the optical amplifier 636 increases the amplification factor for the signal beams by a predetermined ratio. If the control signal includes a command to reduce the amplification factor, the optical amplifier 636 reduces the amplification factor for the signal beams by a predetermined ratio.

An attenuator 637 is provided to adjust the power of each of the wavelengths of the signal beams to a predetermined value.

The attenuator 637 attenuates the power of each of the wavelengths of the signal beams to be input to the quantum dot saturable absorber 620 by a predetermined degree.

The degree by which the attenuator 637 should attenuate the power of each of the wavelengths depends on the characteristics of the waveform shaping performed by the quantum dot saturable absorber 620. Therefore, the administrator should find out the power of each of the wavelengths that is most suitable for the waveform shaping performed by the quantum dot saturable absorber 620 in advance, for example thorough an experiment, and adjust the attenuator 637 so that so each of the wavelengths is adjusted to the most suitable power.

As described above, the waveform shaping apparatus 600 according to the ninth embodiment is not only provided with the amplifier that adjusts the power of the signal beams and the attenuator 637 that attenuates the power of each of the wavelengths of the signal beams, but also can bring down the cross point (the cross point of the eye pattern) in advance, by compressing the pulse width of the signal beams. Because the signal beams with a lowered cross point are input to the quantum dot optical-amplifier and quantum dot saturable absorber, and the waveform shaping is provided therein, the cross point of the signal beam can be kept in the best position.

The various embodiments of the present invention have been explained so far. However, the present invention is not limited to the first to ninth embodiments above, and other embodiments thereof are still possible. Therefore, other possible embodiments will now be explained below, as a tenth embodiment.

Figure 22:
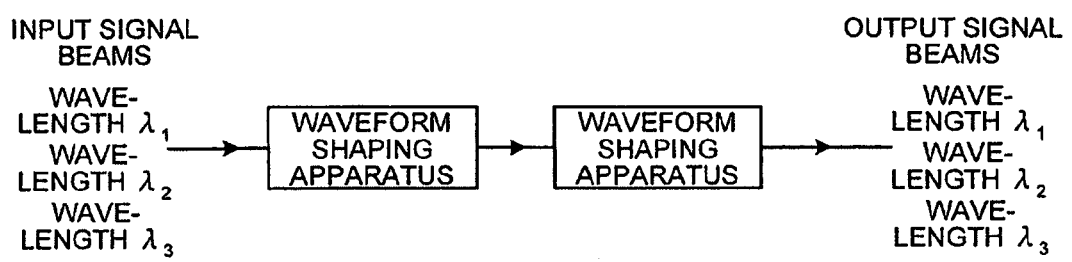
FIG. 22 is a schematic of a configuration with waveform shaping apparatus connected in line.

The noise of the signal beam can be compressed more if the waveform shaping apparatus of the first to the ninth embodiments are connected in series. FIG. 22 is a schematic of a configuration with waveform shaping apparatus connected in series. In the example shown in FIG. 22, two waveform shaping apparatus are connected in series. However, the number of the apparatus is not limited to two, but N waveform shaping apparatus may also be connected in series (where, N is a positive integer of equal to or more than one).

The waveform shaping apparatus according to the second to the ninth embodiments may be applied to an optical transmission system, such as that explained in FIGS. 5 and 6 for the first embodiment. In other words, the waveform shaping apparatus 100 shown in FIG. 5 may be replaced by the waveform shaping apparatus according to the second to the ninth embodiments. In the same manner, the waveform shaping apparatus 100 supported in FIG. 6 may be replaced by the waveform shaping apparatus according to the second to the ninth embodiments.

High reliability communication can be realized by providing the waveform shaping apparatus on the transmission path of the optical transmission system to provide the waveform shaping so as to reduce coding errors. Moreover, communication distance can be extended by providing a plurality of the waveform shaping apparatus on the transmission path of the optical transmission system.

Figure 23:
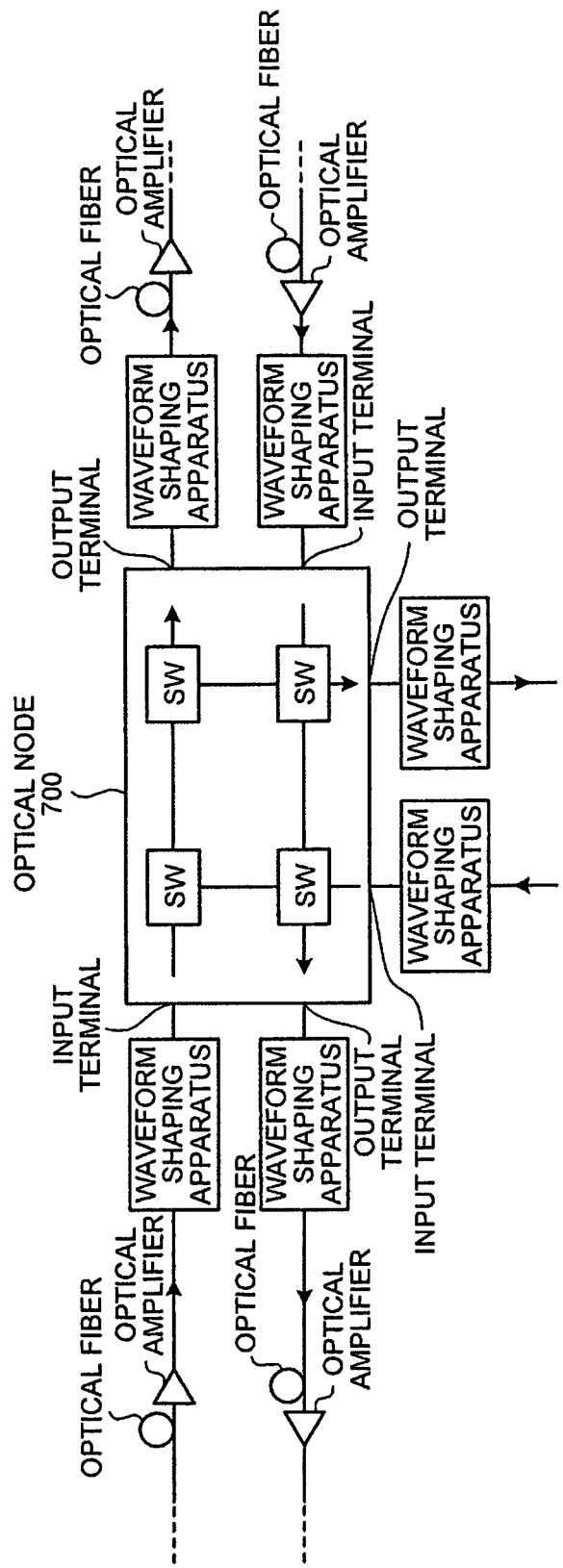
FIG. 23 is a schematic of an optical transmission system where the waveform shaping apparatus is applied to the photonic network.
Figure 24:
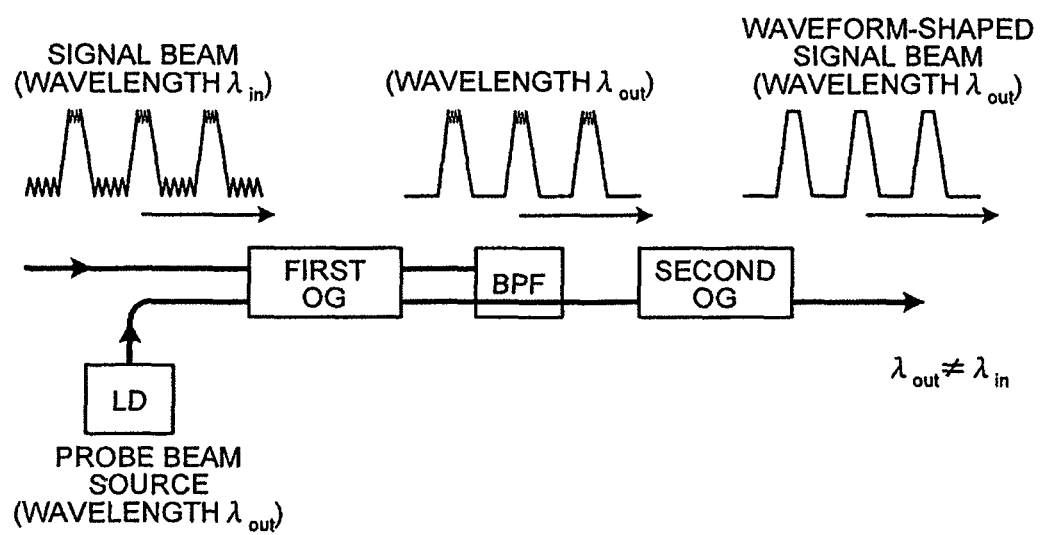
FIG. 24 is a schematic for explaining a waveform shaping technology disclosed in Japanese Patent Application Laid-open No. 2003-15097.

The waveform shaping apparatus according to the second to the ninth embodiments may be applied to a photonic network having transmission paths connected in a mesh topology. FIG. 23 is a schematic of an optical transmission system that the waveform shaping apparatus is applied to the photonic network. An optical node 700 shown in FIG. 23 corresponds to a wavelength-selective switch or a MEMS switch that switches the paths depending on the optical wavelength of signal beams.

In the photonic network, a signal beam takes a various route. Therefore, the waveform of the signal beam input to the optical node 700 is shaped differently. The quality of the signal beams, input to and output from the optical node, can be uniformized by providing the waveform shaping apparatus at the input and the output ends of the optical node 700 as shown in FIG. 23.

The waveform shaping apparatus according to the second to the ninth embodiments include the quantum dot optical amplifier and the quantum dot saturable absorber. However, the quantum dot saturable absorber may be omitted depending on the modulation method used for the signal beams.

For example, if the signal beams are modulated by the phase modulation, the space level noise is often not a problem. Therefore, the quantum dot saturable absorber can be omitted in the waveform shaping apparatus. By omitting the quantum dot saturable absorber, the production cost of the waveform shaping apparatus can be reduced greatly.

In addition to those explained above, the present invention may be realized in more various embodiments within the technical concept of the present invention.

All or parts of the processes explained to be performed automatically may be performed manually, or all or parts of the processes explained to be performed manually may be performed automatically using some known methods.

Information included in this specification or the attached drawings, such as process or control procedures, specific names, various data, or parameters, may be changed in any way unless otherwise specified.

Each element included in each of the apparatus shown in the attached drawings is a representation of functional concept, and is not necessarily configured physically in the arrangement as shown in the drawings. In other words, the specific arrangements in distributing or integrating each apparatus is not limited to those shown in the drawings, and all or parts thereof may be distributed or integrated into given functional or physical units.

According to an aspect of the present invention, the waveform shaping can be provided to the signal beams having different wavelengths without relying on wave polarization, a modulation speed, or a modulation format while maintaining the wavelengths thereof.

Furthermore, according to another aspect of the present invention, because voltages applied to the optical amplifier are adjusted based on the power of the signal beam, more precise waveform shaping can be provided to the signal beams.

Furthermore, according to still another aspect of the present invention, the power of the signal beam, having a predetermined wavelength and to be input to the amplification saturating unit, is amplified depending on characteristics of the amplification saturating unit. Therefore, more precise waveform shaping can be provided to a wide range of signal beams, such as those including various noises.

Furthermore, according to still another aspect of the present invention, a power adjusting unit is provided between the amplification saturating unit and the absorption saturating unit to attenuate the power of the signal beam, having a predetermined wavelength and input from the amplification saturating unit, depending on characteristics of the absorption saturating unit. Therefore, more precise waveform shaping can be provided to the signal beams.

Furthermore, according to still another aspect of the present invention, the power of the signal beams to be input to the amplification saturating unit is amplified so as to be equal to or greater than a predetermined value. Therefore, the amplification saturating unit can remove a mark level noise appropriately.

Furthermore, according to still another aspect of the present invention, a pulse width of the signal beam to be input to the amplification saturating unit is compressed. Therefore, the cross point of the signal beams can be maintained at a best position.

Furthermore, according to still another aspect of the present invention, a plurality of optical amplifiers applied with different voltages can be connected in series. Therefore, the waveform of the signal beams can be compensated at the mark level and the space level.

Furthermore, according to still another aspect of the present invention, the waveform shaping apparatus can be deployed in optical transmission paths. Therefore, the transmission distance can be extended, and more precise waveform shaping can be provided to the signal beams.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A waveform shaping apparatus comprising:
    each of a first optical amplifier and a second optical amplifier that is provided with a substrate having layers of quantum dots and that amplifies a plurality of signal beams respectively having a wavelengths corresponding to sizes of the quantum dots and being multiplexed to be wavelength-division multiplexed signal beam;
    a first applied voltage adjusting unit that adjusts a level of forward bias applied to the first optical amplifier for suppressing noise of the signal by saturating an amplification factor upon determining that noise of the signal exceeds a threshold, the determining being based on obtained information about signal quality;
    an amplification saturating unit that saturates the amplification factor for each of the signal beams in the wavelength-division multiplexed signal beam going through the first optical amplifier by adjusting power of the signal beams in the wavelength-division multiplexed signal beam to be equal to or greater than predetermined values respectively corresponding to the wavelengths, by applying a positive voltage to the first optical amplifier;
    a second applied voltage adjusting unit that adjusts a level of reverse bias applied to the second optical amplifier for suppressing noise of the signal by saturating an absorption factor upon determining that noise of the signal exceeds the threshold, the determining being based on obtained information about signal quality; and
    an absorption saturating unit that saturates the absorption factor for each of the signal beams in the wavelength-division multiplexed signal beam going through the second optical amplifier by adjusting power of the signal beams in the wavelength-division multiplexed signal beam to be under predetermined values respectively corresponding to the wavelengths, by applying a negative voltage to the second optical amplifier.

2. The waveform shaping apparatus according to claim 1, further comprising:
    a power adjusting unit that adjusts power of a signal beam having a predetermined wavelength and to be input to the amplification saturating unit or the absorption saturating unit.

3. The waveform shaping apparatus according to claim 2, wherein the power adjusting unit amplifies the power of the signal beam, having a predetermined wavelength and to be input to the amplification saturating unit, depending on characteristics of the amplification saturating unit.

4. The waveform shaping apparatus according to the claim 3, further comprising:
    a signal beam amplifying unit that amplifies the power of the signal beam to be input to the amplification saturating unit so as to be equal to or more than a predetermined level.

5. The waveform shaping apparatus according to claim 2, wherein the power adjusting unit is positioned between the amplification saturating unit and the absorption saturating unit, and attenuates the power of the signal beam having a predetermined wavelength and input from the amplification saturating unit depending on characteristics of the absorption saturating unit.

6. The waveform shaping apparatus according to the claim 5, further comprising:
    a signal beam amplifying unit that amplifies the power of the signal beam to be input to the amplification saturating unit so as to be equal to or more than a predetermined level.

7. The waveform shaping apparatus according to claim 1, further comprising:
    a pulse width compressing unit that compresses a pulse width of the signal beam to be input to the amplification saturating unit.

8. The waveform shaping apparatus according to claim 1, wherein the amplification saturating unit and the absorption saturating unit are connected in series with respect to a transmission direction of the signal beam.

9. The waveform shaping apparatus according to claim 1, wherein the information about signal quality is a Q-factor from the plurality of signal beams.

10. A waveform shaping apparatus comprising:
    an optical amplifier that is provided with a substrate having layers of quantum dots and that amplifies a plurality of signal beams respectively having wavelengths corresponding to sizes of the quantum dots and being multiplexed to be wavelength-division multiplexed signal beam;
    an applied voltage adjusting unit that adjusts a level of forward bias applied to the optical amplifier for suppressing noise of the signal by saturating an amplification factor upon determining that noise of the signal exceeds a threshold, the determining being based on obtained information about signal quality; and
    an amplification saturating unit that saturates the amplification factor for each of the signal beams in the wavelength-division multiplexed signal beam going through the optical amplifier by adjusting power of the signal beams in the wavelength-division multiplexed signal beam to be equal to or greater than predetermined values respectively corresponding to the wavelengths, by applying a positive voltage to the optical amplifier.

11. An optical transmission system comprising:
    a mesh-topology network having transmission paths for signal beams and optical nodes, and over which terminals exchange data, wherein the optical nodes has a function to switch the transmission paths for the signal beams and separate each of the signal beams into beams at each wavelength; and
    a waveform shaping apparatus is provided to at least one of an input terminal of each of the optical nodes that the signal beam is input to and an output terminal thereof that the signal beam is output from, wherein
    the waveform shaping apparatus includes each of a first optical amplifier and a second optical amplifier that is provided with a substrate having layers of quantum dots and that amplifies a plurality of signal beams respectively having wavelengths corresponding to sizes of the quantum dots and being multiplexed to be wavelength-division multiplexed signal beam, a first applied voltage adjusting unit that adjusts a level of forward bias applied to the first optical amplifier for suppressing noise of the signal by saturating an amplification factor upon determining that noise of the signal exceeds a threshold, the determining being based on obtained information about signal quality, an amplification saturating unit that saturates the amplification factor for each of the signal beams in the wavelength-division multiplexed signal beam going through the first optical amplifier by adjusting power of the signal beams in the wavelength-division multiplexed signal beam to be equal to or greater than predetermined values respectively corresponding to the wavelengths, by applying a positive voltage to the first optical amplifier, a second applied voltage adjusting unit that adjusts a level of reverse bias applied to the second optical amplifier for suppressing noise of the signal by saturating n absorption factor upon determining that noise of the signal exceeds the threshold, the determining being based on obtained information about signal quality, and an absorption saturating unit that saturates the absorption factor for each of the signal beams in the wavelength-division multiplexed signal beam going through the second optical amplifier by adjusting power of the signal beams in the wavelength-division multiplexed signal beam to be under predetermined values respectively corresponding to the wavelengths, by applying a negative voltage to the second optical amplifier.

12. An optical transmission system comprising:

a mesh-topology network having transmission paths for signal beams and optical nodes, and over which terminals exchange data, wherein the optical nodes has a function to switch the transmission paths for the signal beams and separate each of the signal beams into beams at each wavelength; and a waveform shaping apparatus is provided to at least one of an input terminal of each of the optical nodes that each of the signal beams is input to and an output terminal thereof that each of the signal beams is output from, wherein the waveform shaping apparatus includes an optical amplifier that is provided with a substrate having layers of quantum dots and that amplifies a plurality of signal beams respectively having wavelengths corresponding to sizes of the quantum dots and being multiplexed to be wavelength-division multiplexed signal beam, an applied voltage adjusting unit that adjusts a level of forward bias applied to the optical amplifier for suppressing noise of the signal by saturating an amplification factor upon determining that noise of the signal exceeds a threshold, the determining being based on obtained information about signal quality, and an amplification saturating unit that saturates the amplification factor for each of the signal beams in the wavelength-division multiplexed signal beam going through the optical amplifier by adjusting power of the signal beams in the wavelength-division multiplexed signal beam to be equal to or greater than predetermined values respectively corresponding to the wavelengths, by applying a positive voltage to the optical amplifier.

13. An optical transmission system comprising:

a network having transmission paths of an optical fiber, the network being used by terminals to exchange data, wherein a waveform shaping apparatus is provided between the transmission paths, and the waveform shaping apparatus includes each of a first optical amplifier and a second optical amplifier that is provided with a substrate having layers of quantum dots and that amplifies a plurality of signal beams respectively having wavelengths corresponding to sizes of the quantum dots and being multiplexed to be wavelength-division multiplexed signal beam, a first applied voltage adjusting unit that adjusts a level of forward bias applied to the first optical amplifier for suppressing noise of the signal by saturating an amplification factor upon determining that noise of the signal exceeds a threshold, the determining being based on obtained information about signal quality, an amplification saturating unit that saturates the amplification factor for each of the signal beams in the wavelength-division multiplexed signal beam going through the first optical amplifier by adjusting power of the signal beams in the wavelength-division multiplexed signal beam to be equal to or greater than predetermined values respectively corresponding to the wavelengths, by applying a positive voltage to the first optical amplifier;

a second applied voltage adjusting unit that adjusts a level of reverse bias applied to the second optical amplifier for suppressing noise of the signal by saturating an absorption factor upon determining that noise of the signal exceeds the threshold, the determining being based on obtained information about signal quality, and an absorption saturating unit that saturates the absorption factor for each of the signal beams in the wavelength-division multiplexed signal beam going through the second optical amplifier by adjusting power of the signal beams in the wavelength-division multiplexed signal beam to be under predetermined values respectively corresponding to the wavelengths, by applying a negative voltage to the second optical amplifier.

14. An optical transmission system comprising:

a network having transmission paths of an optical fiber, the network being used by terminals to exchange data, wherein a waveform shaping apparatus is provided between the transmission paths, and the waveform shaping apparatus includes an optical amplifier that is provided with a substrate having layers of quantum dots and that amplifies a plurality of signal beams respectively having wavelengths corresponding to sizes of the quantum dots and being multiplexed to be wavelength-division multiplexed signal beam;

an applied voltage adjusting unit that adjusts a level of forward bias applied to the optical amplifier for suppressing noise of the signal by saturating an amplification factor upon determining that noise of the signal exceeds a threshold, the determining being based on obtained information about signal quality; and an amplification saturating unit that saturates the amplification factor for each of the signal beams in the wavelength-division multiplexed signal beam going through the optical amplifier by adjusting power of the signal beams in the wavelength-division multiplexed signal beam to be equal to or greater than predetermined values respectively corresponding to the wavelengths, by applying a positive voltage to the optical amplifier.

15. A waveform shaping method for a waveform shaping apparatus that includes a first optical amplifier and a second optical amplifier, each of which is provided with a substrate having layers of quantum dots and that amplifies a plurality of signal beams respectively having wavelengths corresponding to sizes of the quantum dots and being multiplexed to be wavelength-division multiplexed signal beam, the waveform shaping method comprising:

adjusting a level of forward bias applied to the first optical amplifier for suppressing noise of the signal by saturating an amplification factor upon determining that noise of the signal exceeds a threshold, the determining being based on obtained information about signal quality;

saturating the amplification factor for each of the signal beams in the wavelength-division multiplexed signal beam going through the first optical amplifier by adjusting power of the signal beams in the wavelength-division multiplexed signal beam to be equal to or greater than predetermined values respectively corresponding to the wavelengths, by applying a positive voltage to the first optical amplifier;

adjusting a level of reverse bias applied to the second optical amplifier for suppressing noise of the signal by saturating an absorption factor upon determining that noise of the signal exceeds the threshold, the determining being based on obtained information about signal quality; and saturating the absorption factor for each of the signal beams in the wavelength-division multiplexed signal beam going through the second optical amplifier by adjusting power of the signal beams in the wavelength-division multiplexed signal beam to be under predetermined values respectively corresponding to the wavelengths, by applying a negative voltage to the second optical amplifier.

16. The waveform shaping method according to claim 15, further comprising:

a power adjusting unit that adjusts power of a signal beam having a predetermined wavelength and to be input to the first optical amplifier or the second optical amplifier.

17. A waveform shaping method for a waveform shaping apparatus that includes each of a first optical amplifier and a second optical amplifier each that is provided with a substrate having layers of quantum dots and that amplifies a plurality of signal beams respectively having wavelengths corresponding to sizes of the quantum dots and being multiplexed to be wavelength-division multiplexed signal beam, the waveform shaping method comprising:

adjusting a level of reverse bias applied to the second optical amplifier for suppressing noise of the signal by saturating an absorption factor upon determining that noise of the signal exceeds the threshold, the determining being based on obtained information about signal quality;

saturating the absorption factor for each of the signal beams in the wavelength-division multiplexed signal beam going through the second optical amplifier by adjusting power of the signal beams in the wavelength-division multiplexed signal beam to be under predetermined values respectively corresponding to the wavelengths, by applying a negative voltage to the second optical amplifier;

adjusting a level of forward bias applied to the first optical amplifier for suppressing noise of the signal by saturating an amplification factor upon determining that noise of the signal exceeds a threshold, the determining being based on obtained information about signal quality; and saturating the amplification factor for each of the signal beams in the wavelength-division multiplexed signal beam going through the first optical amplifier by adjusting power of the signal beams in the wavelength-division multiplexed signal beam to be equal to or greater than predetermined values respectively corresponding to the wavelengths, by applying a positive voltage to the first optical amplifier.

18. The waveform shaping method according to claim 17, further comprising:

a power adjusting unit that adjusts power of a signal beam having a predetermined wavelength and to be input to the first optical amplifier or the second optical amplifier.

* * * * *

UNITED STATES PATENT AND TRADEMARK OFFICE
CERTIFICATE OF CORRECTION

PATENT NO. : 8,428,470 B2
APPLICATION NO. : 12/073035
DATED : April 23, 2013
INVENTOR(S) : Fumio Futami et al.

Page 1 of 1

It is certified that error appears in the above-identified patent and that said Letters Patent is hereby corrected as shown below:

In the Claims

Column 25, Line 26, In Claim 11, delete "n" and insert -- an --, therefor.

Signed and Sealed this
Thirtieth Day of July, 2013

Teresa Stanek Rea
*Acting Director of the United States Patent and Trademark Office*